(12) United States Patent
Nishiyama et al.

(10) Patent No.: US 7,327,071 B2
(45) Date of Patent: Feb. 5, 2008

(54) SURFACE ACOUSTIC WAVE DEVICE

(75) Inventors: Kenji Nishiyama, Yasu (JP); Eiichi Takata, Nagaokakyo (JP); Takeshi Nakao, Omihachiman (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/469,505

(22) Filed: Sep. 1, 2006

(65) Prior Publication Data
US 2006/0290233 A1  Dec. 28, 2006

Related U.S. Application Data

(63) Continuation of application No. PCT/JP2005/002895, filed on Feb. 23, 2005.

(30) Foreign Application Priority Data
Mar. 2, 2004  (JP) .............................. 2004-057935

(51) Int. Cl.
H01L 41/08 (2006.01)
(52) U.S. Cl. ............................... 310/313 A; 310/313 R
(58) Field of Classification Search ............ 310/313 A, 310/313 R, 363, 364
See application file for complete search history.

(56) References Cited

U.S. PATENT DOCUMENTS

| 4,243,960 | A | * | 1/1981 | White et al. | ................. | 333/196 |
| 5,726,610 | A | * | 3/1998 | Allen et al. | .................. | 333/133 |
| 5,923,231 | A | * | 7/1999 | Ohkubo et al. | ............. | 333/193 |
| 2003/0174028 | A1 | | 9/2003 | Takayama et al. | | |
| 2004/0164644 | A1 | | 8/2004 | Nishiyama et al. | | |

FOREIGN PATENT DOCUMENTS

EP    1 391 988 A2    2/2004

(Continued)

OTHER PUBLICATIONS

International Search Report issued in the corresponding International Application No. PCT/JP2005/002895, mailed on Jun. 14, 2005.

*Primary Examiner*—Mark Budd
(74) *Attorney, Agent, or Firm*—Keating & Bennett, LLP

(57) ABSTRACT

A surface acoustic wave device includes a piezoelectric substrate made of $LiTaO_3$ or $LiNbO_3$ having an electromechanical coefficient of about 15% or more, at least one electrode which is disposed on the piezoelectric substrate and which is a laminate film having a metal layer defining a primary metal layer primarily composed of a metal having a density higher than that of Al or an alloy of the metal and a metal layer which is laminated on the primary metal layer and which is composed of another metal, and a first $SiO_2$ layer which is disposed in a remaining area other than that at which the at least one electrode is located and which has a thickness approximately equivalent to that of the electrode. In the surface acoustic wave device described above, the density of the electrode is at least about 1.5 times that of the first $SiO_2$ layer. In addition, a second $SiO_2$ layer disposed so as to cover the electrode and the first $SiO_2$ layer and a silicon nitride compound layer disposed on the second $SiO_2$ layer are further provided.

7 Claims, 23 Drawing Sheets

FOREIGN PATENT DOCUMENTS

| | | |
|---|---|---|
| JP | 61-063103 A | 4/1986 |
| JP | 61-136312 A | 6/1986 |
| JP | 02-036608 A | 2/1990 |
| JP | 02-301210 A | 12/1990 |
| JP | 08-097671 A | 4/1996 |
| JP | 11-186866 A | 7/1999 |
| JP | 2000-216160 A | 8/2000 |
| JP | 2001-044787 A | 2/2001 |
| JP | 2003-188679 A | 7/2003 |
| JP | 2004-112748 A | 4/2004 |
| JP | 2004-519171 A | 6/2004 |
| WO | 02/35702 A1 | 5/2002 |
| WO | 02/067423 A1 | 8/2002 |

* cited by examiner

<SIM IMAGE>

<FE-SEM IMAGE>

<SIM IMAGE>

<FE-SEM IMAGE>

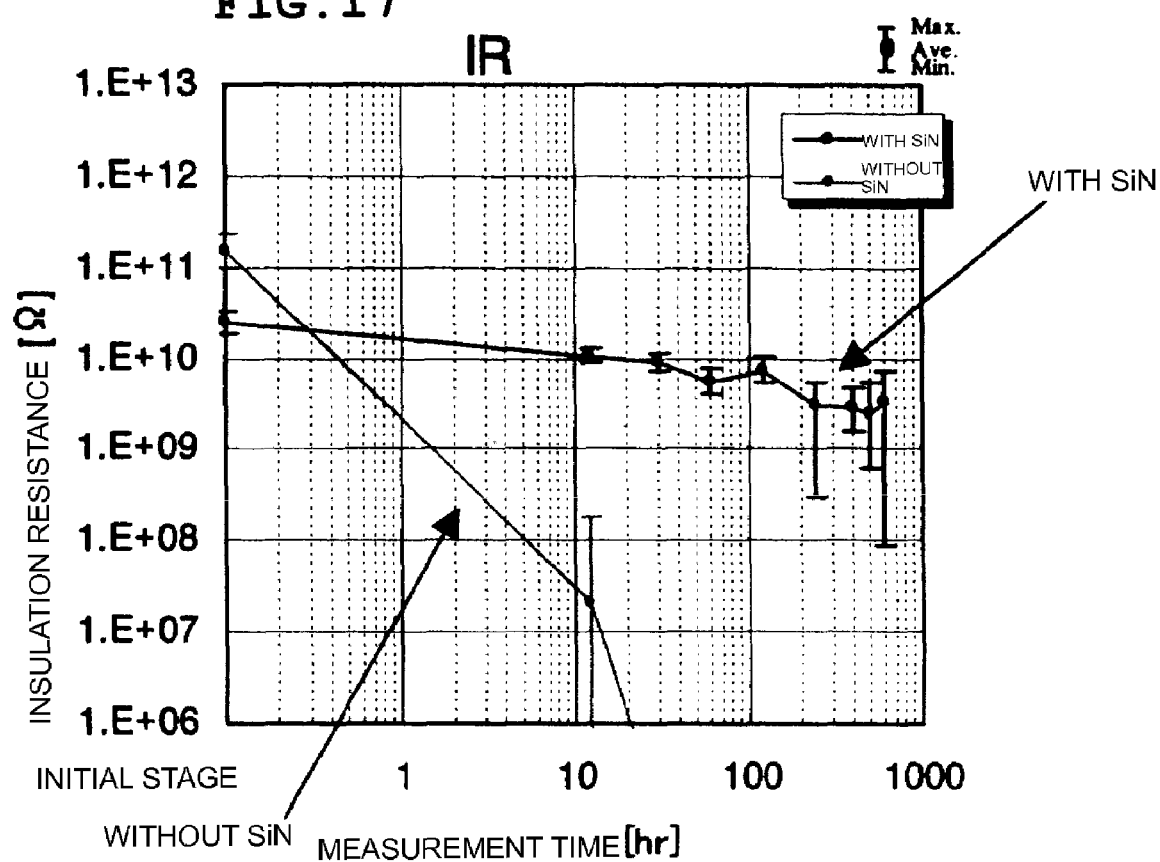

SURFACE ACOUSTIC WAVE DEVICE

BACKGROUND OF THE INVENTION

1. Field of the Invention

The present invention relates to a surface acoustic wave device used, for example, for a resonator and a band pass filter, and more particularly, relates to a surface acoustic wave device having a structure in which an insulating layer is arranged so as to cover electrodes.

2. Description of the Related Art

A DPX and an RF filter used for mobile communication systems have been required to satisfy broadband properties and superior temperature properties. Heretofore, in a surface acoustic wave device used for a DPX and an RF filter, a piezoelectric substrate of 36° to 50° rotated Y-plate X-propagation $LiTaO_3$ has been used. This piezoelectric substrate has a frequency-temperature coefficient of approximately −40 ppm/° C. to −30 ppm/° C. Hence, in order to improve the temperature properties, a method has been used in which a $SiO_2$ film having a positive frequency-temperature coefficient is formed on the piezoelectric substrate so as to cover an IDT electrode. In FIGS. 18A-18D, one example of a manufacturing method of this type of surface acoustic wave device is shown.

As shown in FIG. 18A, a resist pattern 52 is formed on a piezoelectric substrate 51 except for portions at which the IDT electrode is to be formed. Next, as shown in FIG. 18B, in order to form the IDT electrode, an electrode film 53 is formed over the entire surface. Subsequently, by using a resist stripping solution, the resist patter 52 and the metal film provided thereon are removed. As described above, as shown in FIG. 18C, an IDT electrode 53A is formed. Next, as shown in FIG. 18D, a $SiO_2$ film 54 is formed so as to cover the IDT electrode 53A.

On the other hand, for a purpose different from that for improving frequency-temperature properties described above, a manufacturing method of a surface acoustic wave device is disclosed in Japanese Unexamined Patent Application Publication No. 11-186866 (Patent Document 1) in which an insulating or an semi-conductive protective film is formed so as to cover an IDT electrode of the surface acoustic wave device. FIG. 19 is a schematic cross-sectional view of the surface wave device described in this prior art. In a surface acoustic wave device 61, an IDT electrode 63 of Al or an alloy primarily made of Al is formed on a piezoelectric substrate 62. In a region other than that at which the IDT electrode 63 is provided, an insulating or an anti-conductive inter-electrode-finger film 64 is formed. In addition, so as to cover the IDT electrode 63 and the inter-electrode-finger film 64, an insulating or an anti-conductive film 65 is formed. In the surface acoustic wave device 61 described in this prior art, the inter-electrode-finger film 64 and the protective film 65 are formed of an insulating material, such as $SiO_2$, or an anti-conductive material, such as silicon. In this method, with the formation of an inter-electrode-finger film 64, degradation in properties caused by discharge between the electrode fingers induced by the pyroelectric properties of a piezoelectric substrate 62 is suppressed.

In addition, in Japanese Unexamined Patent Application Publication No. 61-136312 (Patent Document 2), a one-port type surface acoustic wave resonator is disclosed in which after electrodes made of a metal such as aluminum or gold are formed on a piezoelectric substrate made of quartz or lithium niobate, and a $SiO_2$ film is further formed, planarization of the $SiO_2$ film is performed. In this case, due to the planarization, superior resonant properties are obtained.

As shown in FIGS. 18A-18D, in a conventional manufacturing method of a surface acoustic wave device in which a $SiO_2$ film is formed in order to improve the frequency-temperature properties, the surface height of the $SiO_2$ film 54 disposed at locations at which the IDT electrode is present and the surface height at which the IDT electrode is not present are different from each other. Thus, the presence of irregularities of the surface of the $SiO_2$ film 54 causes a problem in that the insertion loss is degraded. In addition, as the thickness of the IDT electrode is increased, the irregularities are increased. Accordingly, the thickness of the IDT electrode cannot be sufficiently increased.

On the other hand, in the surface acoustic wave device described in Patent Document 1, after the inter-electrode-finger film 64 is formed between electrode fingers of the IDT 63, the protective film 65 is formed. Accordingly, the surface of the protective film 65 can be planarized.

However, according to the structure described in Patent Document 1, the IDT electrode 63 is formed of Al or an alloy primarily composed of Al. Although the inter-electrode-finger film 64 is formed so as to be in contact with this IDT electrode 63, a sufficient reflection coefficient cannot be obtained at the IDT electrode 63. As a result, for example, there has been a problem in that ripples are generated in the resonant properties.

Furthermore, in the manufacturing method described in Patent Document 1, prior to the formation of the protective film 65, the resist formed on the inter-electrode-finger film 64 must be removed using a resist stripping solution. However, in this step, the IDT electrode 63 may be corroded by a resist stripping solution. Thus, as a metal forming the IDT electrode, a metal that is susceptible to corrosion cannot be used. That is, the type of metal forming the IDT electrode is limited.

On the other hand, in the one-port type surface acoustic wave resonator described in Patent Document 2, it has been disclosed that quartz or lithium niobate is used as the piezoelectric substrate and the electrode is formed of aluminum or gold. However, the situation in which an electrode made of Al is formed on a quartz substrate is only described as an example. That is, a surface acoustic wave device using another substrate material and/or another metal material has not been specifically described.

SUMMARY OF THE INVENTION

To overcome the problems described above, preferred embodiments of the present invention provide a surface acoustic wave device in which an insulating layer is formed on an electrode and in which the properties are not degraded by ripples which appear, for example, in resonant properties. That is, a surface acoustic wave device is provided which has superior resonant properties and filter properties.

As described above, in Patent Document 2, it has been disclosed that superior resonant properties can be obtained by planarization of the upper surface of the $SiO_2$ film. Hence, the inventors of the present invention formed a one-port type surface acoustic wave resonator having a structure that is equivalent to that described in Patent Document 2 except that a $LiTaO_3$ substrate having a high electromechanical coefficient was used as the piezoelectric substrate, and subsequently, the properties of the resonator were determined. That is, after an electrode of Al was formed on the $LiTaO_3$ substrate, a $SiO_2$ film was formed, and the surface of the $SiO_2$ film was then planarized. However, after the SiO$_2$ film was formed, the properties were severely degraded, and it was determined that the resonator cannot be practically used.

When a LiTaO$_3$ substrate or a LiNbO$_3$ substrate is used which has a high electromechanical coefficient as compared to that of quartz, the fractional band width is significantly increased. However, according to detailed investigation performed by the inventors of the present invention, as shown in FIGS. 2 and 3, it was found that when an electrode of Al is formed on a LiTaO$_3$ substrate, and a SiO$_2$ film is further formed, by planarization of the surface of the SiO$_2$ film, the reflection coefficient is drastically decreased to approximately 0.02. FIGS. 2 and 3 are graphs each showing the relationship between the reflection coefficient and an electrode thickness H/λ of a surface acoustic wave device in which an IDT electrode of gold or platinum is formed on a LiTaO$_3$ substrate of Euler angles (0°, 126°, 0°) so as to have various thicknesses, and a SiO$_2$ film is further formed. Solid lines in FIGS. 2 and 3 indicate the changes in reflection coefficient when the surface of the SiO$_2$ film is not planarized as schematically shown in FIGS. 2 and 3, and dotted lines indicate the changes in reflection coefficient when the surface of the SiO$_2$ film is planarized.

As shown in FIGS. 2 and 3, when a conventional electrode made of Al is used, by planarizing the surface of the SiO$_2$ film, regardless of the electrode thickness, it is understood that the reflection coefficient is drastically decreased to approximately 0.02. Thus, it has been believed that a sufficient stop band cannot be obtained and that sharp ripples are generated in the vicinity of an antiresonant frequency.

In addition, heretofore, it has been known that the reflection coefficient is increased as the electrode thickness is increased. However, as shown in FIGS. 2 and 3, in the case in which an electrode made of Al is used, although the thickness of the electrode is increased, the refection coefficient is not increased when the surface of the SiO$_2$ film is planarized.

On the other hand, as shown in FIGS. 2 and 3, in the case in which the electrode is formed from Au or Pt, even when a surface of the SiO$_2$ film is planarized, the reflection coefficient is increased as the electrode thickness is increased. Various investigations were performed by the inventors of the present invention based on the findings as described above, and as a result, the present invention was developed.

According to a preferred embodiment of the present invention, a surface acoustic wave device includes a piezoelectric substrate made of LiTaO$_3$ or LiNbO$_3$, which has an electromechanical coefficient of at least about 15%, at least one electrode disposed on the piezoelectric substrate and which is a laminate having a metal layer defining a primary metal layer primarily composed of a metal having a density higher than that of Al or an alloy primarily composed of the metal and a metal layer which is laminated on the primary metal layer and which is composed of another metal, and a first SiO$_2$ layer which is disposed in a remaining area other than that at which the at least one electrode is disposed and which has a thickness approximately equal to that of the at least one electrode. In the surface acoustic wave device described above, the density of the electrode is at least about 1.5 times that of the first SiO$_2$ layer. In addition, a second SiO$_2$ layer arranged so as to cover the electrode and the first SiO$_2$ layer and a silicon nitride compound layer disposed on the second SiO$_2$ layer are further provided.

In another preferred embodiment of the surface acoustic wave device according to the present invention, when the thickness of the second SiO$_2$ film is represented by h, and the wavelength of a surface acoustic wave is represented by λ, $0.08 \leq h/\lambda \leq 0.5$ is preferably satisfied.

In another preferred embodiment of the surface acoustic wave device according to the present invention, when the silicon nitride compound layer is composed of an SiN layer, the thickness of the SiN layer is represented by h, and the wavelength of a surface acoustic wave is represented by λ, $0 < h/\lambda \leq 0.1$ is preferably satisfied.

In this case, the silicon nitride compound layer may be Si$_3$N$_4$ or other suitable silicon nitride compound other than SiN.

In another preferred embodiment of the surface acoustic wave device according to the present invention, a diffusion inhibition film is further provided which is made of SiN and which is disposed between the second SiO$_2$ layer and the electrode, and when the thickness of the diffusion inhibition film is represented by h, and the wavelength of a surface acoustic wave is represented by λ, $0.005 \leq h/\lambda \leq 0.05$ is preferably satisfied.

In another preferred embodiment of the surface acoustic wave device according to the present invention, the electrode is composed of one of Cu or a Cu alloy, or a laminate film having a metal layer primarily composed of Cu or a Cu alloy.

In another preferred embodiment of the surface acoustic wave device according to the present invention, when the piezoelectric substrate is formed of rotated-Y plate X propagating LiTaO$_3$ or LiNbO$_3$, the thickness of the second SiO$_2$ layer is represented by h$_1$, the thickness of the silicon nitride compound layer formed on the second SiO$_2$ layer is represented by h$_2$, the wavelength of a surface acoustic wave is represented by λ, and the following equations are satisfied: coefficient A$_1$=−190.48, coefficient A$_2$=76.19, coefficient A$_3$=−120.00, coefficient A$_4$=−47.30, coefficient A$_5$=55.25, H$_1$=h$_1$/λ, H$_2$=h$_2$/λ, and θ=(A$_1$H$_1^2$+A$_2$H$_1$+A$_3$)H$_2$+A$_4$H$_1$+A$_5$, a Y-X cut angle of the rotated Y-plate X-propagation piezoelectric substrate is in the range of θ±5°.

In the surface acoustic wave device according to preferred embodiments of the present invention, on the piezoelectric substrate, the electrode is preferably composed of a metal having a density higher than that of Al, an alloy primarily composed of the metal, or a laminate having a metal layer composed of a metal having a density higher than that of Al or an alloy primarily composed of the metal, the first SiO$_2$ layer having a thickness approximately equal to that of the electrode is disposed in a remaining area other than that at which the electrode is provided, and the second SiO$_2$ layer is disposed so as to cover the electrode and the first SiO$_2$ layer. In the surface acoustic wave device described above, the density of the electrode is preferably set to at least about 1.5 times that of the first SiO$_2$ layer. Thus, when the upper surface of the second SiO$_2$ layer is planarized, ripples which appear in resonant properties and/or filter properties are moved out of the band, and in addition, the ripples are prevented and minimized. In addition, superior frequency-temperature properties are achieved.

In addition, since the silicon nitride compound layer is disposed on the second SiO$_2$ layer, the properties can be adjusted and improved. Furthermore, by performing dry etching of the SiN, the frequency can be adjusted without changing TCF and the fractional band width.

In addition, in the case in which $0.08 \leq h/\lambda \leq 0.5$ is satisfied, where the thickness of the second SiO$_2$ film is represented by h, and the wavelength of a surface acoustic wave is represented by λ, as will be apparent from experimental results described below, the frequency-temperature properties TCF is improved. That is, the absolute value of TCF is decreased.

In addition, in the case in which $0 \leq h/\lambda \leq 0.1$ is satisfied, where the silicon nitride compound layer is composed of SiN, the thickness of the SiN is represented by h, and the wavelength of a surface acoustic wave is represented by $\lambda$, the absolute value of the frequency-temperature properties TCF is further decreased, and a surface acoustic wave device having a smaller change in frequency-temperature properties TCF is provided.

Furthermore, in the case in which $0.005 \leq h/\lambda \leq 0.05$ is satisfied, where the diffusion inhibition film made of SiN is disposed between the second $SiO_2$ layer and the electrode, the thickness of the diffusion inhibition film is represented by h, and the wavelength of a surface acoustic wave is represented by $\lambda$, the amount of change in frequency-temperature properties TCF is decreased, and in addition, resistance properties are improved when a direct current voltage is applied. In addition, when the diffusion inhibition film is provided, diffusion of an electrode material to the second $SiO_2$ layer is prevented, and thus, the surface of the second $SiO_2$ layer can be further planarized. Since the diffusion of the metal forming the electrode to the $SiO_2$ layer is prevented, degradation defects of properties in a high temperature load test are not likely to occur. Thus, the resistance properties are improved when a direct current is applied.

When an electrode of Cu or an alloy primarily composed of Cu or an electrode made of a laminate having an electrode layer of Cu or an alloy primarily composed of Cu is used, an electrode can be provided which is inexpensive and which has superior conductivity.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 17 is a graph showing the results of a high temperature load test for the surface acoustic wave device of the second preferred embodiment and for a surface acoustic wave device of a comparative example in which a diffusion inhibition film made of SiN is not formed.

DETAILED DESCRIPTION OF PREFERRED EMBODIMENTS

Hereinafter, with reference to the figures, particular preferred embodiments of the present invention will be described so as to facilitate the understanding of the present invention.

With reference to FIG. 20A-20G, a reference example of a manufacturing method of a surface acoustic wave device will be described, the reference example being not yet known or disclosed to the public and being the base of the present invention.

Figure 20A:
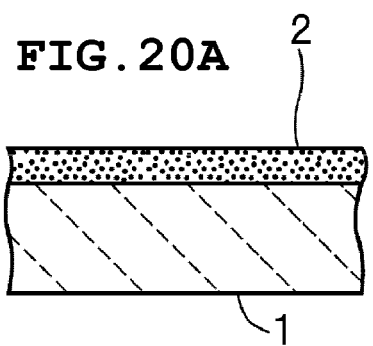
FIGS. 20A to 20G are schematic, partially cut-away, cross-sectional views illustrating a method for manufacturing a surface acoustic wave device of one example according to a preferred embodiment of the present invention.

As shown in FIG. 20A, first, a $LiTaO_3$ substrate 1 is prepared. In this reference example, a 36° Y-plate X-propagation $LiTaO_3$ substrate of Euler angles (0°, 126°, 0°) is used. However, as the piezoelectric substrate, another $LiTaO_3$ substrate having a different crystal orientation may also be used, or a substrate made of another piezoelectric crystal may also be used. In addition, a piezoelectric substrate made of a piezoelectric thin film laminated on an insulating substrate may also be used. Incidentally, θ of Euler angles (φ, θ, ψ) corresponds to the cut angle+90°.

A first $SiO_2$ layer 2 is formed over the entire surface of the $LiTaO_3$ substrate 1. In this reference example, the first $SiO_2$ layer 2 is made of a $SiO_2$ film.

A method for forming the first $SiO_2$ layer 2 may be performed by an optional method, such as printing, deposition, or sputtering. In addition, the thickness of the first $SiO_2$ layer 2 is set to be equal to that of an IDT electrode which is to be formed in a subsequent step.

Figure 20D:
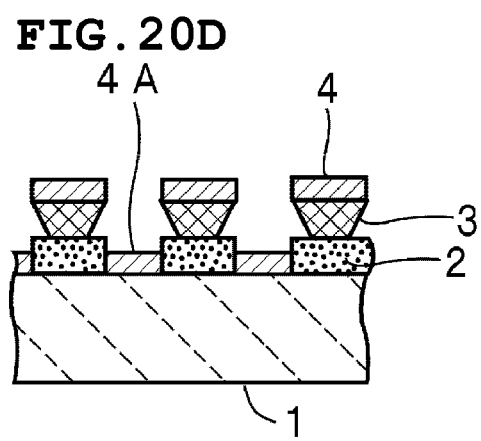
Figure 20B:
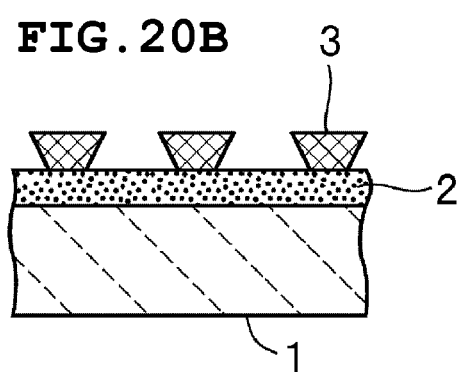

Next, as shown in FIG. 20B, using a photolithographic technique, a resist pattern 3 is formed. The resist pattern 3 is formed so that a resist is located at positions other than those at which IDT is to be formed.

Figure 20E:
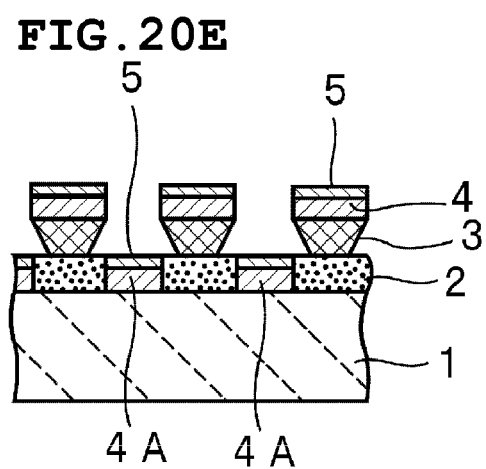
Figure 20C:
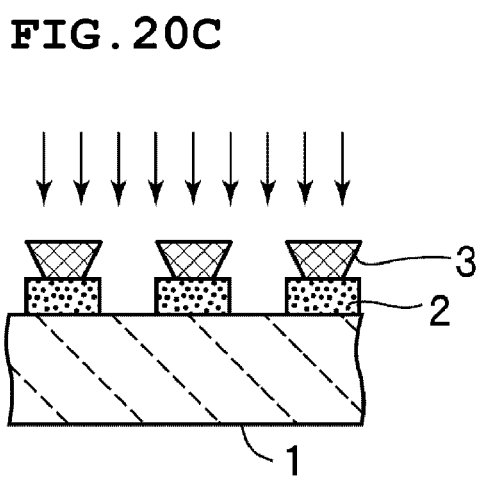
Figure 20F:
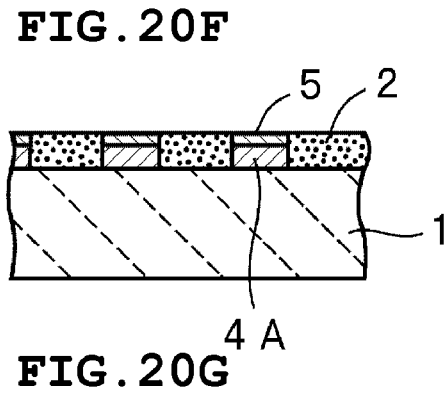

Next, with a reactive ion etching method (RIE) performed by ion irradiation as shown by arrows in FIG. 20C, portions of the first $SiO_2$ layer 2 other than the portions located under the resist pattern 3 are removed.

When $SiO_2$ is etched by RIE using a fluorinated gas, residues may be generated by a polymerization reaction. In this case, after RIE, treatment may be performed using BHF (buffered hydrofluoric acid) or other suitable treatments.

Subsequently, a Cu film and a Ti film are formed so as to have a thickness equivalent to that of the first $SiO_2$ layer 2. As shown in FIG. 20D, in a region at which the first $SiO_2$ layer 2 is removed, that is, in a region at which IDT is to be formed, a Cu film 4 is formed, and simultaneously, the Cu film 4 is also formed on the resist pattern 3. Next, a Ti film 5 is formed as an entire surface-protection metal film. As shown in FIG. 20E, the Ti film 5 is formed on the upper surface of an IDT electrode 4A and the Cu film 4 is formed on the resist pattern 3. Thus, for the IDT electrode 4A, the side surfaces thereof are covered with the first $SiO_2$ layer 2 and the upper surface is covered with the Ti film 5. As described above, the IDT electrode 4A and the protection metal film are formed so that the total of the thickness of the IDT electrode 4A and that of the Ti film 5 used as the protection metal film is substantially equal to the thickness of the first $SiO_2$ layer 2.

Next, using a resist stripping solution, the resist pattern 3 is removed. As described above, as shown in FIG. 20F, a structure is obtained in which the IDT electrode 4A is formed in the region other than that at which the first $SiO_2$ layer 2 is provided and in which the upper surface of the IDT electrode 4A is covered with the Ti film 5.

Figure 20G:
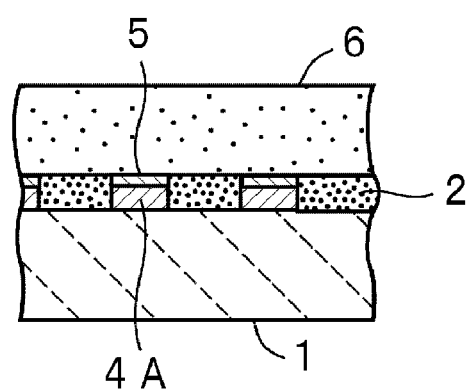

Then, as shown in FIG. 20G, a $SiO_2$ film is formed over the entire surface as a second $SiO_2$ layer 6.

Figure 4:
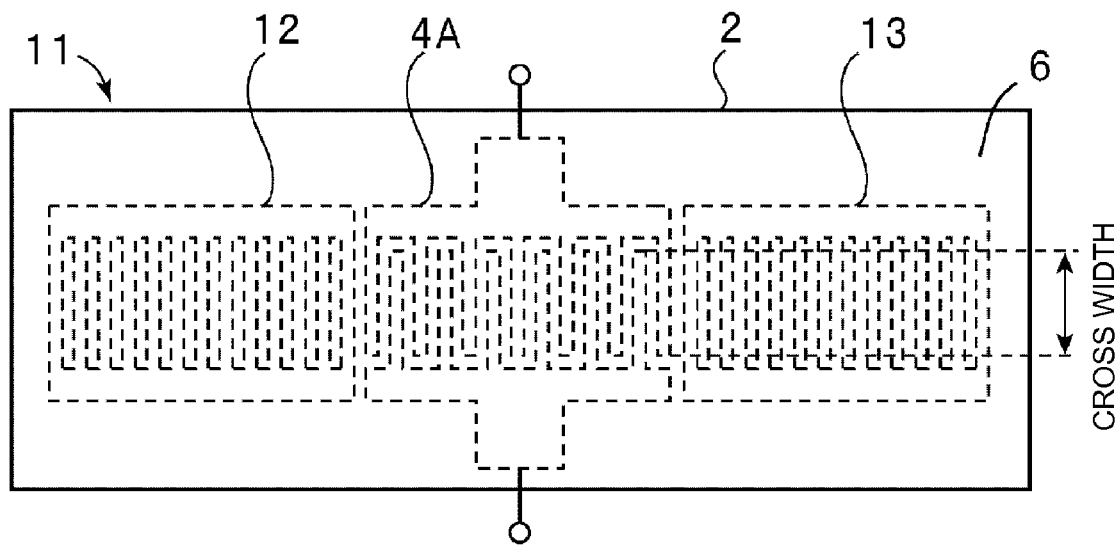
FIG. 4 is a front view illustrating an electrode structure of the surface acoustic wave device of the first preferred embodiment, in which the state is shown before a SiN layer is formed.

As described above, a one-port type surface acoustic wave resonator 11 having the electrode structure shown in FIG. 4 is obtained.

In FIGS. 20A to 20G, only the portion at which the IDT electrode 4A is formed is particularly described. However, as shown in FIG. 4, the surface acoustic wave resonator 11 includes reflectors 12 and 13 at two sides of the IDT electrode 4A in the propagation direction of a surface acoustic wave. The reflectors 12 and 13 are also formed in the same step as the IDT electrode 4A.

In the above reference example, since the one-port type surface acoustic wave resonator 11 is formed, the IDT electrode 4A is formed on the $LiTaO_3$ substrate 1. However, depending on the application of the surface acoustic wave device, a plurality of IDT electrodes may be formed, and in addition, reflectors may be formed in the same step as the IDTs as described above or may not be provided at all.

Figure 21:
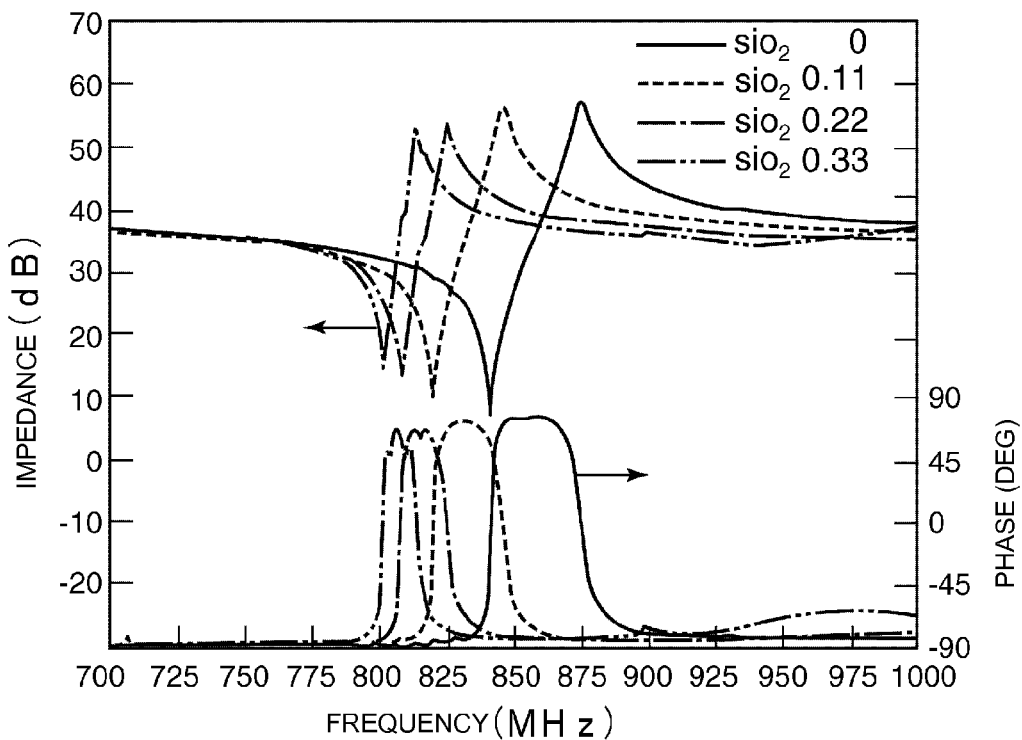
FIG. 21 is a graph showing the relationship among the phase properties, impedance properties, and normalized thickness of the thickness of a $SiO_2$ film of a surface acoustic wave device obtained by a manufacturing method according to the comparative example.

For comparison purposes, in accordance with the conventional manufacturing method of a surface acoustic wave device having a $SiO_2$ film, shown in FIGS. 18A-18D, a one-port type surface acoustic wave resonator was formed. Also in this comparative example, as a substrate material, a 36° rotated Y-plate X-propagation $LiTaO_3$ substrate having Euler angle of (0°, 126°, 0°) was used, and the IDT electrode was formed from Cu. As is apparent from the manufacturing method shown in FIGS. 18A-18D, after the IDT electrode 53A is formed, the $SiO_2$ film 54 is formed, and as a result, irregularities cannot be prevented from being formed on the surface of the $SiO_2$ film 54. In FIG. 21, the impedance properties and the phase properties are shown which are obtained in the comparative example in which a normalized thickness h/λ (where h indicates the thickness of the IDT electrode, and λ indicates the wavelength of a surface acoustic wave) of an IDT electrode made of Cu is set to about 0.042 and in which a normalized thickness Hs/λ (where Hs indicates the thickness of the $SiO_2$ film) of the $SiO_2$ film is set to about 0.11, about 0.22, and about 0.33. As shown in FIG. 21, as the normalized thickness Hs/λ of the $SiO_2$ film is increased, the impedance ratio, the ratio between an impedance at the antiresonant point and an impedance at the resonant point, is decreased.

Figure 22:
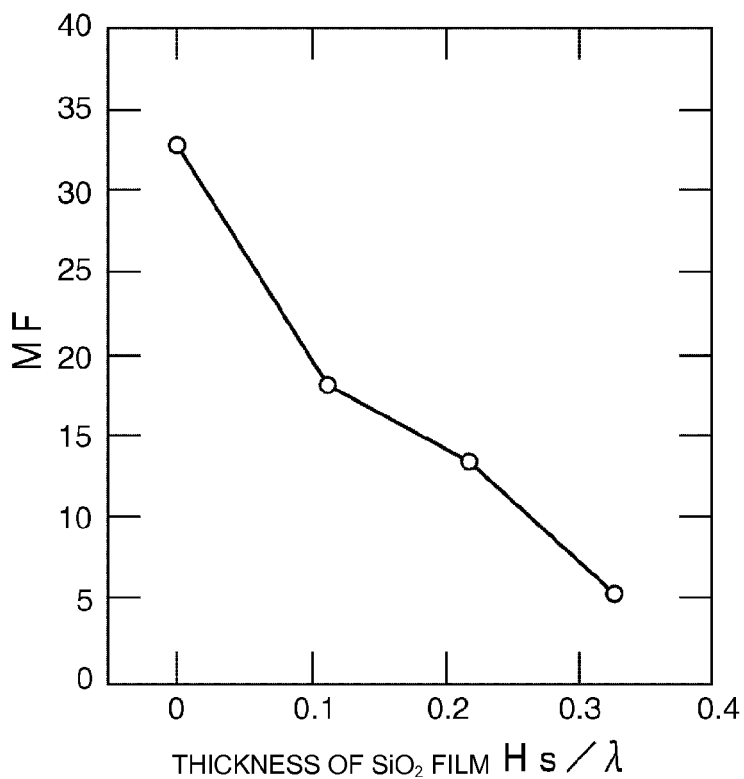
FIG. 22 is a graph showing the relationship between MF of a resonator and the thickness of a $SiO_2$ film of a surface acoustic wave device prepared for comparison purposes.

In addition, in FIG. 22, the relationship between the normalized thickness Hs/λ of the $SiO_2$ film of the surface acoustic wave resonator formed in the comparative example and MF (Figure of Merit) of the resonator is shown. As shown in FIG. 22, as the thickness of the $SiO_2$ film is increased, MF is decreased.

That is, when the IDT electrode and the $SiO_2$ film are formed in accordance with the conventional method shown in FIG. 18, even if the IDT electrode is formed from Cu, as the thickness of the $SiO_2$ film is increased, the properties are severely degraded. The reason for this is believed to be the afore-mentioned irregularities that are inevitably generated on the surface of the $SiO_2$ film.

Figure 23:
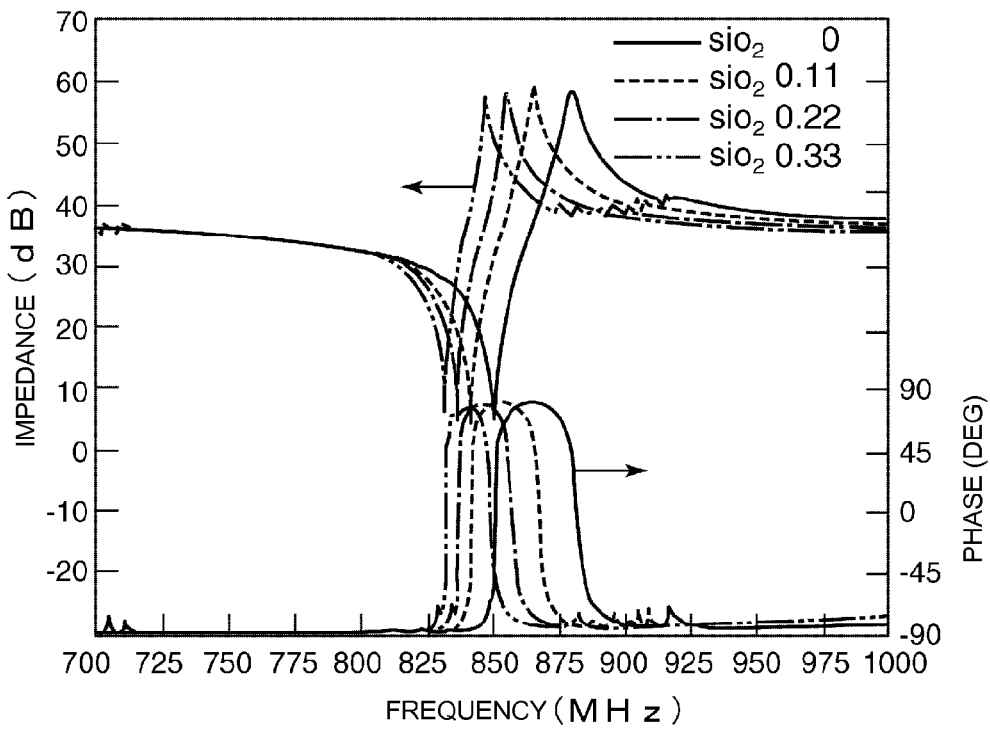
FIG. 23 is a graph showing the changes in impedance properties and phase properties obtained when the normalized thickness of a $SiO_2$ film of a surface acoustic wave device is changed in a manufacturing method of the reference example.
Figure 24:
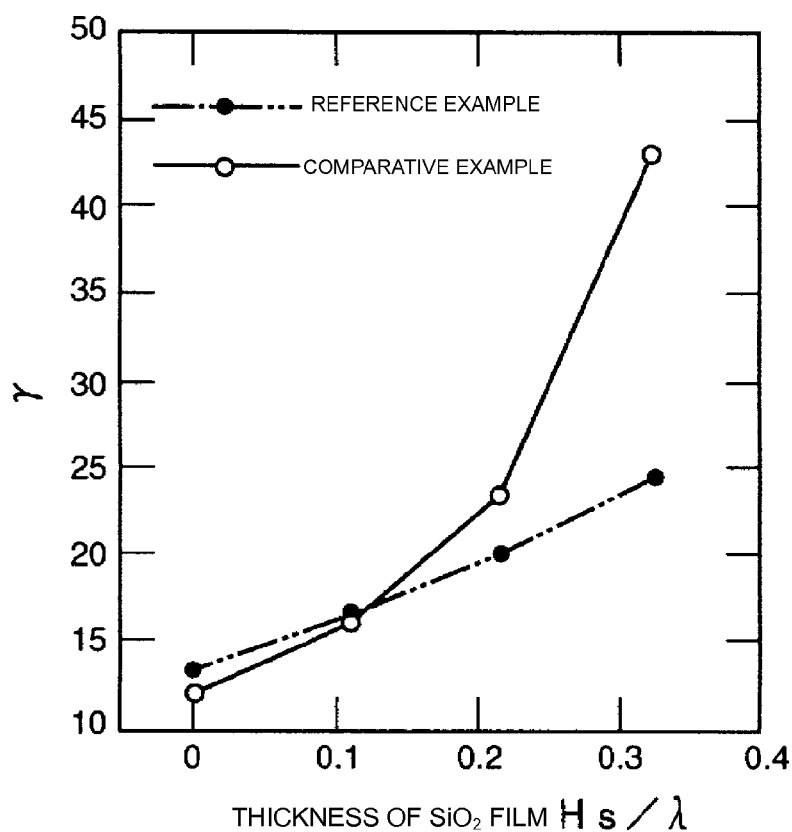
FIG. 24 is a graph showing the relationship between the thicknesses of a $SiO_2$ film of each surface acoustic wave resonator and γ thereof, said each resonator being obtained by a manufacturing method according to the reference example or the comparative example.
Figure 25:
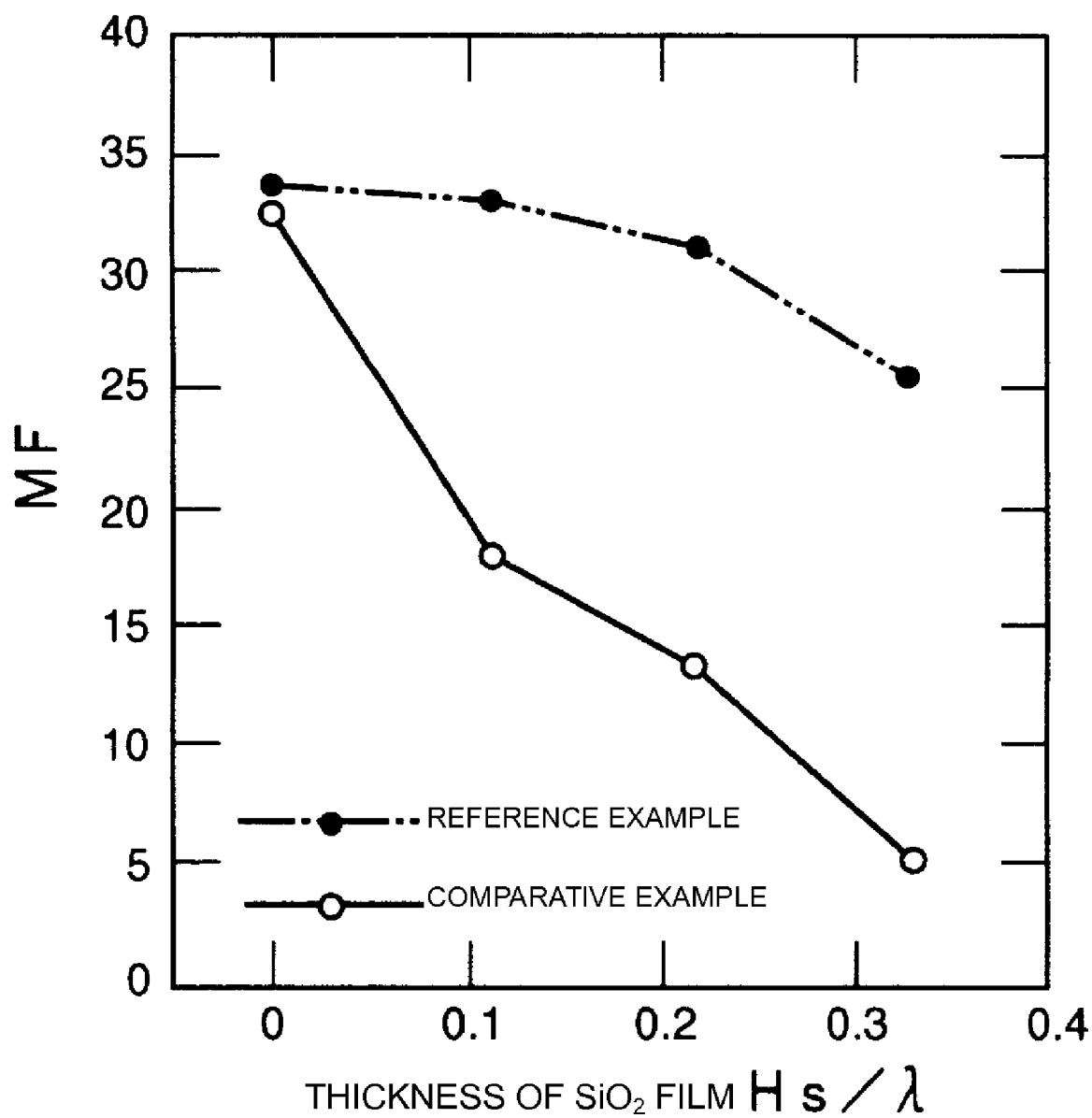
FIG. 25 is a graph showing the relationship between the thickness of a $SiO_2$ film of each surface acoustic wave resonator and MF thereof, the resonator being obtained by a manufacturing method according to the reference example or the comparative example.

On the other hand, according to the manufacturing method of this reference example, even when the thickness of the $SiO_2$ film is increased, the properties are not substantially degraded as shown in FIGS. 23 to 25.

FIG. 23 is a graph showing the changes in impedance properties and phase properties obtained by changing the thickness of the $SiO_2$ film of the surface acoustic wave resonator 11 formed in accordance with the above reference example, that is, by changing the thickness of the second $SiO_2$ layer 6. In addition, dotted lines in FIGS. 24 and 25 show the changes in capacitance ratio γ and MF of a resonator obtained when the thickness Hs/λ of the $SiO_2$ film is changed in the reference example. Incidentally, when the electromechanical coefficient is represented by $k^2$, the capacitance ratio γ can be approximated by an equation of the form $γ=1/k^2-1$, based on the theory of piezoelectric bulk waves, and it is preferable since the electromechanical coefficient $k^2$ increases as γ decreases.

In addition, in FIGS. 24 and 25, the results of the above comparative example are shown by solid lines.

When the results in FIG. 23 are compared with those in FIG. 21, in the above reference example, it is understood that even when the normalized thickness Hs/λ of the $SiO_2$ film is increased, the decrease in impedance is not likely to occur as compared to that in the comparative example.

In addition, from the results shown in FIGS. 24 and 25, it is understood that according to the manufacturing method of the reference example, the degradation in properties concomitant with the increase in normalized thickness Hs/λ of the $SiO_2$ film is suppressed as compared to that of the comparative example.

That is, according to the manufacturing method of the reference example, even when the thickness of the $SiO_2$ film is increased as described above, the impedance ratio is not likely to substantially decrease, and the degradation in properties is prevented and minimized.

Figure 26:
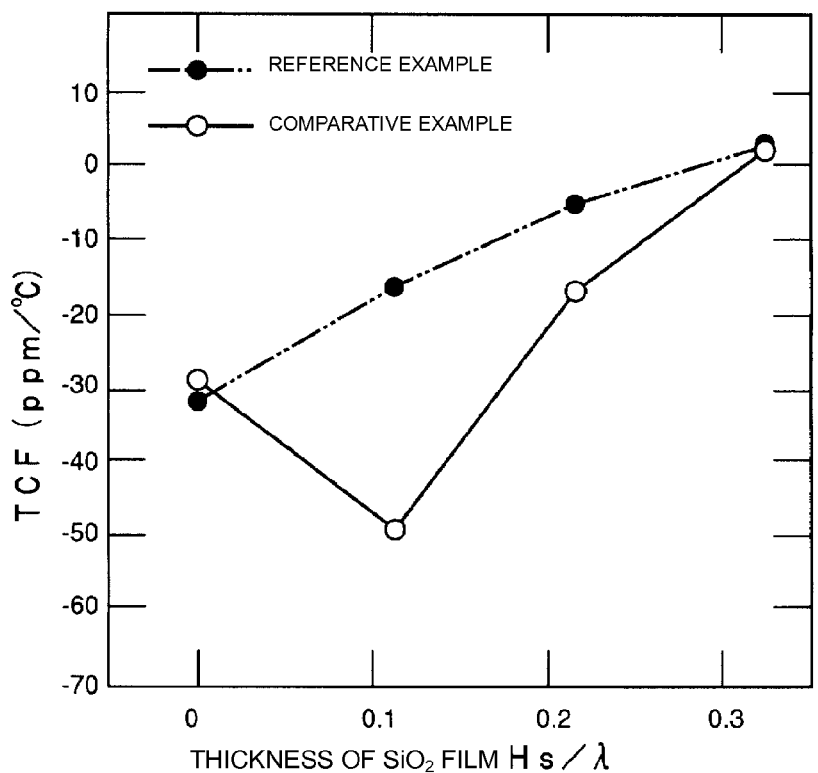
FIG. 26 is a graph showing the relationship between the change in frequency-temperature properties TCF and the thickness of a $SiO_2$ film of each resonator prepared in the reference example or the comparative example.

In addition, FIG. 26 is a graph showing the relationship between the thickness of the $SiO_2$ film and the frequency-temperature properties TCF of surface acoustic wave resonators obtained by the manufacturing methods according to the comparative example and the reference example.

In FIG. 26, the solid line and the dotted line indicate the results of the comparative example and the reference example, respectively.

As shown in FIG. 26, according to the manufacturing method of the reference example, when the thickness of the $SiO_2$ film is increased, the frequency-temperature properties TCF is ideally improved in accordance with the increase in thickness. In addition, as shown in FIG. 26, where the thickness of the $SiO_2$ film is represented by h, and the wavelength of a surface acoustic wave is represented by λ, when h/λ is in the range of about 0.08 to about 0.5, the frequency-temperature properties TCF are increased to more than about −20 ppm/° C., that is, the absolute value of the frequency-temperature properties TCF is decreased to less than about 20 ppm/° C., and the variation in frequency-temperature properties TCF is effectively suppressed. Accordingly, in a surface acoustic wave device of a preferred embodiment of the present invention, which will be described later, when the thickness of a second $SiO_2$ film is represented by h, $h/\lambda$ is preferably set in the range of about 0.08 to about 0.5 as described below.

Thus, it is understood that when the manufacturing method of the above reference example is used, a surface acoustic wave resonator is provided in which the properties are not likely to be degraded and in which the temperature properties are effectively improved.

In addition, in the manufacturing method of the reference example, the IDT electrode is formed of Cu which has a density greater than that of Al. Thus, the IDT electrode 4A has a sufficient reflection coefficient, and undesired ripples which appear in the resonant properties are prevented and minimized. The reasons for this will be described below.

A surface acoustic wave resonator according to a second comparative example was formed in a similar manner to that of the above reference example except that an Al film was used instead of Cu. However, the normalized thickness $Hs/\lambda$ of the $SiO_2$ film was set to about 0.08. That is, the normalized thickness of the thickness of the first $SiO_2$ film was set to about 0.08. The impedance and the phase properties of the surface acoustic wave resonator are shown by solid lines in FIG. 27.

Figure 27:
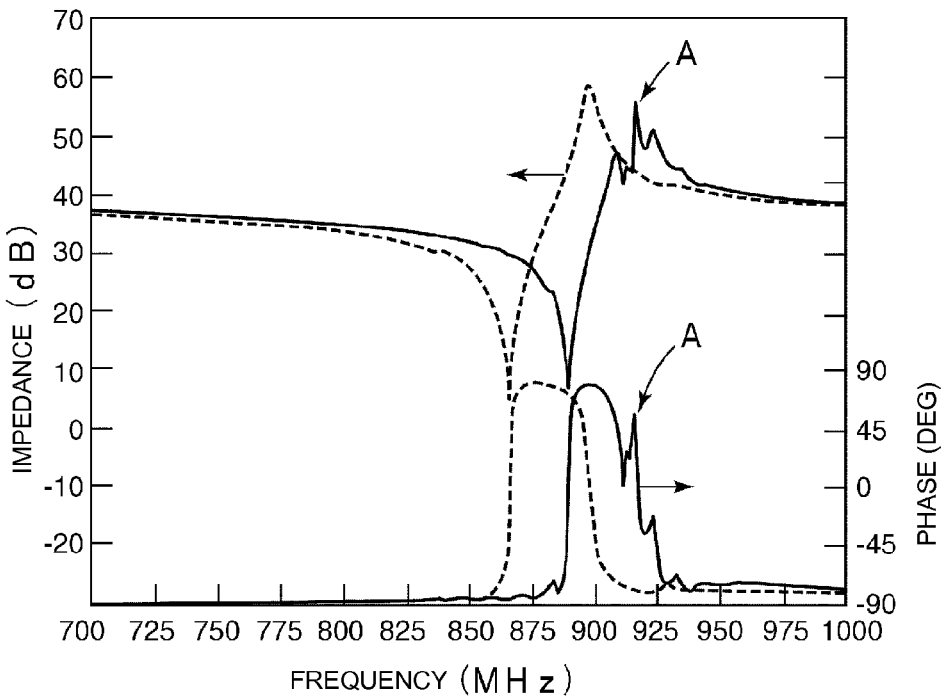
FIG. 27 is a graph showing the impedance-frequency properties of a surface acoustic wave device having a $SiO_2$ film prepared in a second comparative example and the above properties of that having no $SiO_2$ film.

In addition, the impedance and the phase properties of a surface acoustic wave resonator, which was formed in a manner similar to that of the second comparative example except that the $SiO_2$ film was not formed, are shown by dotted lines in FIG. 27.

As apparent from the solid lines shown in FIG. 27, although the manufacturing method was performed in accordance with that of the above reference example, when the IDT electrode is formed of Al and the $SiO_2$ film is formed, a large ripple shown by an arrow A in FIG. 27 appears between the resonant point and the antiresonant point. In addition, in the surface acoustic wave resonator having no $SiO_2$ film, no ripples as described above appear.

Hence, it is understood that although it is intended to improve the frequency-temperature properties by the formation of the $SiO_2$ film, when the IDT electrode is formed of Al, the ripple A appears, and as a result, the properties are degraded. Through investigation further performed on the above point by the inventors of the present invention, it was determined that when a metal having a density greater than that of Al is used for the IDT electrode, the reflection coefficient thereof can be increased, and that the ripple A is thereby eliminated.

That is, in accordance with a manufacturing method similar to that of the above reference example, surface acoustic wave resonators are formed in a similar manner to that of the above reference example, while the density of a metal forming the IDT electrode 4 was variously changed. The impedance properties of the surface acoustic wave resonators formed as described above are shown in FIGS. 28A to 28E. FIGS. 28A to 28E show the results obtained at ratios $\rho_1/\rho_2$ of 2.5, 2.0, 1.5, 1.2, and 1.0, respectively, where $\rho_1$ indicates the average density of a laminate structure formed of the IDT electrode and the protective metal film, and $\rho_2$ indicates the density of the first $SiO_2$ layer.

Figure 28A:
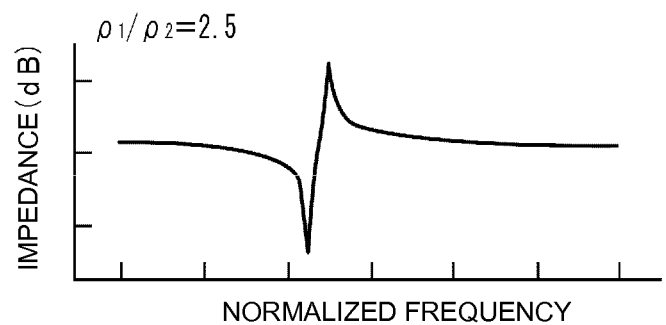
FIGS. 28A to 28E are graphs each showing the change in impedance properties when the ratio of the average density of an IDT electrode and a protective metal film to the density of a first $SiO_2$ layer.
Figure 28B:
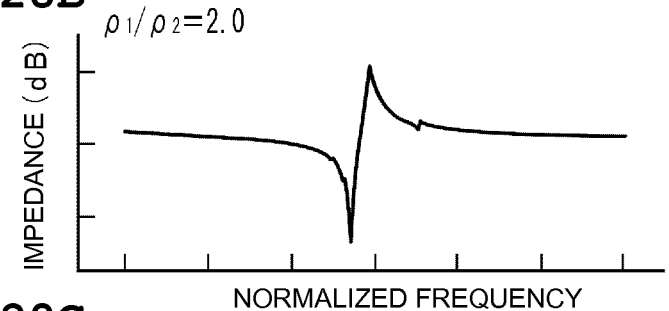
Figure 28C:
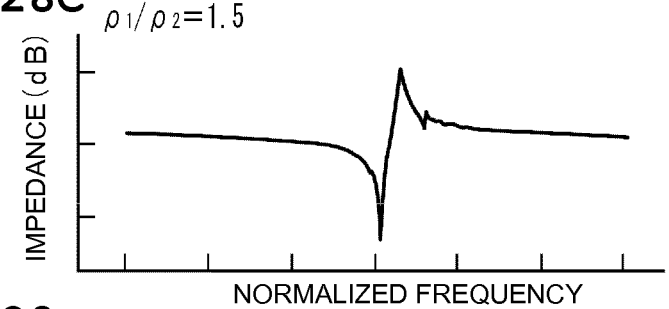
Figure 28D:
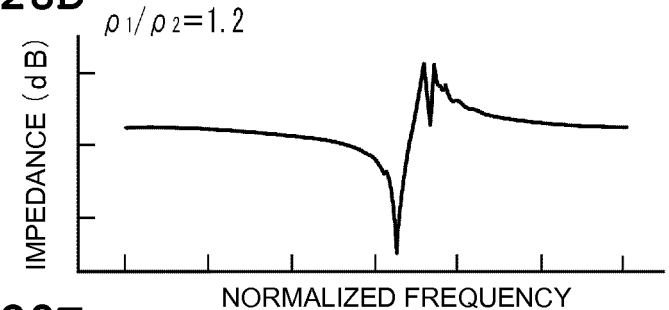
Figure 28E:
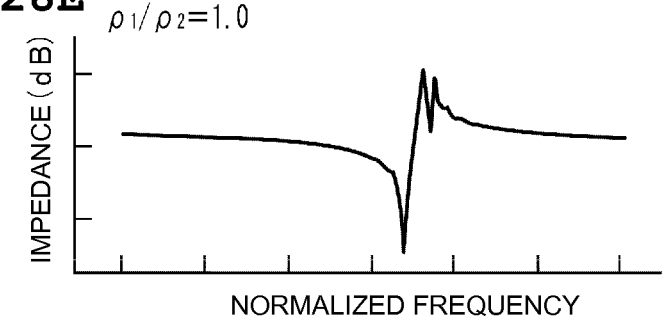

As shown in FIGS. 28A to 28C, the ripple A is shifted out of the band and, in addition, as shown in FIG. 28A, the ripple A is significantly suppressed.

Thus, from the results shown in FIGS. 28A to 28E, it is understood that when the density ratio of the laminate structure of the IDT electrode and the protective metal film to the first $SiO_2$ layer is set to at least about 1.5 times, the ripple A is shifted outside the band between the resonant frequency and the antiresonant frequency such that superior properties are obtained. In addition, it is understood that when the density ratio is more preferably set to at least about 2.5 times, the ripple itself is reduced.

In FIGS. 28A to 28E, since the Ti film is laminated on the IDT electrode 4A in accordance with the above reference example, the above average density is used. However, in the present invention, the protective metal film may not be provided on the IDT electrode 4A. In this case, the thickness of the IDT electrode 4A is preferably equal to that of the first $SiO_2$ layer, and the ratio of the density of the IDT electrode to that of the first $SiO_2$ layer is preferably set to at least about 1.5 times, and is more preferably set to at least about 2.5 times. As a result, it was confirmed that effects similar to those described above are also obtained.

Therefore, in a surface acoustic wave resonator in which the IDT electrode is covered with a $SiO_2$ film, it is understood that when the density of the IDT electrode or the average density of the laminate of the IDT electrode and the protective metal film is greater than the density of the first $SiO_2$ layer located at the side of the IDT electrode, the reflection coefficient of the IDT electrode is increased and that, as a result, the degradation in properties shown between the resonant point and the antiresonant point is prevented and minimized.

In addition, as the metal or the alloy, which has a density greater than that of Al, instead of Cu, for example, Ag, Au, or an alloy primarily formed therefrom may be used.

In addition, when the protective metal film is laminated on the IDT electrode as in the above reference example, as shown in the manufacturing method of FIGS. 20A to 20G, since the side surfaces and the upper surface of the IDT electrode 4A are covered with the first $SiO_2$ layer 2 and the protective metal film 6, respectively, when the resist pattern 3 is removed, the IDT electrode 4A is prevented from being corroded. Thus, a surface acoustic wave resonator having more superior properties is provided.

Furthermore, instead of $SiO_2$, the first and the second $SiO_2$ layers may be formed of an insulating material, such as $SiO_xN_y$, having a temperature-property improving effect. In addition, the first and the second $SiO_2$ layers may be formed of different insulating materials or may be formed of the same material as described above.

Figure 29:
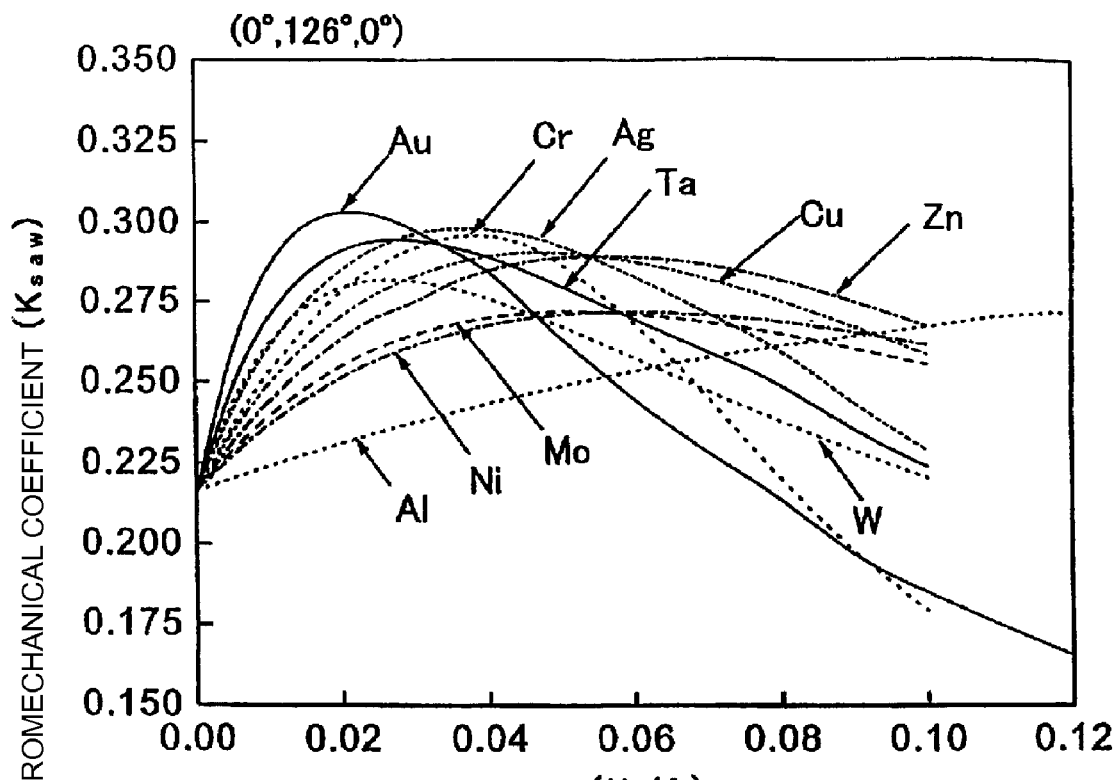
FIG. 29 is a graph showing the change in electromechanical coefficient obtained when IDT electrodes are formed on a $LiTaO_3$ substrate of Euler angles (0°, 126°, 0°) using various metals having various thicknesses.

FIG. 29 is a graph showing the relationship between the electromechanical coefficient and the normalized thickness $H/\lambda$ of the IDT electrode which is formed on a $LiTaO_3$ substrate having Euler angles (0°, 126°, 0°) using various metals having various thicknesses.

Figure 30:
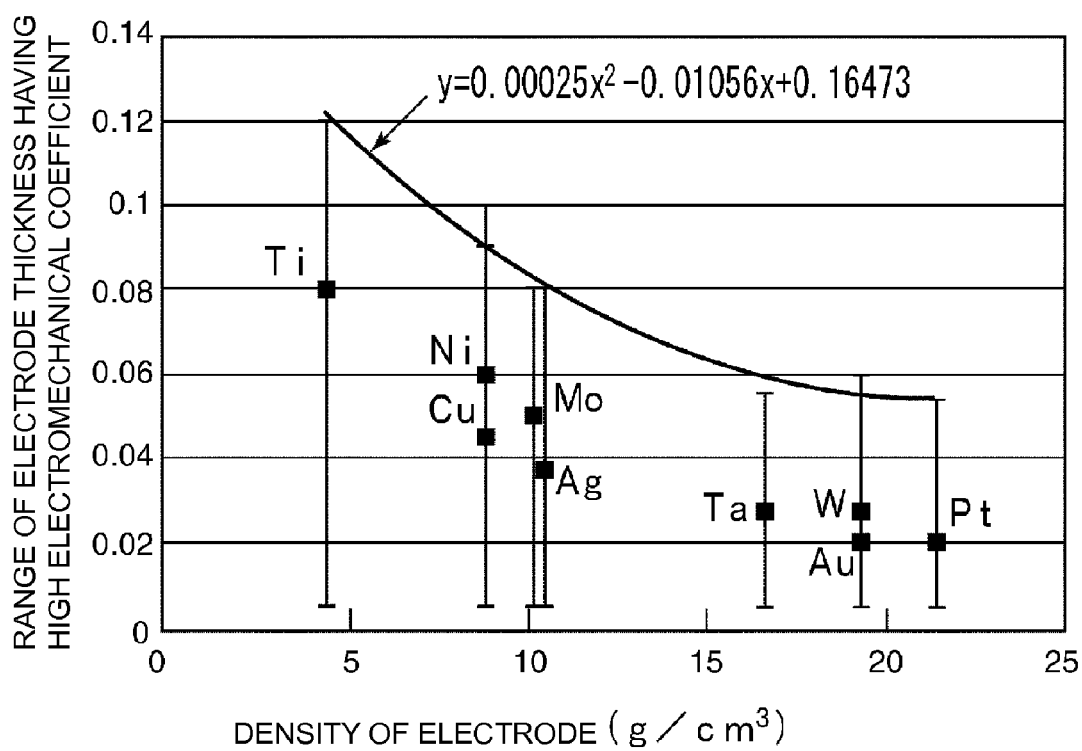
FIG. 30 is a graph showing the relationship between the density of an electrode material and the range of an electrode thickness in which when an IDT electrode is formed on a $LiTaO_3$ substrate using various metals, the electromechanical coefficient is increased as compared to that obtained when an electrode made of Al is used.

The normalized thickness of the electrode at which the electromechanical coefficient is greater than that of Al was investigated for each metal from the data obtained from FIG. 29, and the results shown in FIG. 30 were obtained. That is, in the graph shown in FIG. 30, the electrode thickness ranges are shown in which the electromechanical coefficient is greater than that of the IDT electrode formed from Al as described above, those ranges being obtained when IDT electrodes are formed using metals having various densities on the $LiTaO_3$ substrate.

In FIG. 30, in the thickness range of the electrode of each metal, an upper limit is a limiting value in the range in which the electromechanical coefficient of the metal is greater than that of Al, and a lower limit of the electrode thickness range of each metal is determined based on formation ability. When the upper limit is approximated by a quadratic expression, $y=0.00025x^2-0.01056x+0.16473$ is satisfied, where y indicates the range of an electrode thickness having a large electromechanical coefficient, and x indicates the density.

Thus, as apparent from the description of particular examples using various different electrode materials, which will be described later, in the structure in which the electrode is formed on a piezoelectric substrate of a 14°~50° rotated Y-plate X-propagation (Euler angles: (0°, 104°~140°, 0°) $LiTaO_3$, and in which the $SiO_2$ film is further formed so as to have a normalized thickness H/λ in the range of about 0.03 to about 0.45, when the normalized thickness H/λ of the electrode satisfies the following equation:

$$0.005 \leq H/\lambda \leq 0.00025 \times \rho^2 - 0.01056 \times \rho + 0.16473 \quad \text{Equation (1),}$$

as apparent from the results shown in FIG. 30, the electromechanical coefficient is increased. In the above equation, ρ indicates the average density of the electrode.

In addition, the electrode is formed of the afore-mentioned metal having a density greater than that of aluminum. In this case, the electrode may be formed of a metal having a density greater than that of aluminum or may be formed of an alloy primarily composed of aluminum. In addition, the electrode may be formed of a laminate having a major metal film made of aluminum or an alloy primarily composed of aluminum and a minor metal film made of a metal different from that used for the above-described major metal film. When the electrode is formed of a laminate film, the average density of the electrode preferably satisfies the equation $\rho 0 \times 0.7 \leq \rho \leq \rho 0 \times 1.3$, where ρ0 indicates the metal density of the major electrode layer.

In addition, in the present invention, although the surface of the second $SiO_2$ layer is planarized as described above, the planarization may be performed such that the irregularities are about 30% or less of the thickness of the electrode. When the irregularities are more than about 30%, the advantageous effects of the planarization may not be sufficiently obtained.

Furthermore, as described above, the planarization of the second $SiO_2$ layer may be performed using various methods. For example, a planarization method performed by an etchback step, a planarization method using an oblique incidence effect by a reverse sputtering effect, a method for polishing an insulating layer surface, or a method for polishing an electrode may be used. Alternatively, at least two of these methods may be used in combination.

First Preferred Embodiment

Figure 1:
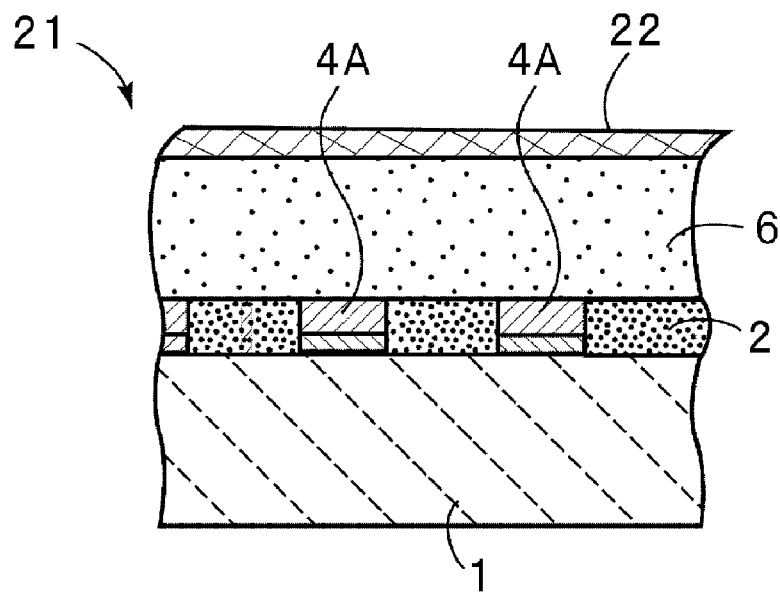
FIG. 1 is a schematic, partially cut-away, cross-sectional front view of a surface acoustic wave device of a first preferred embodiment according to the present invention.
Figure 2:
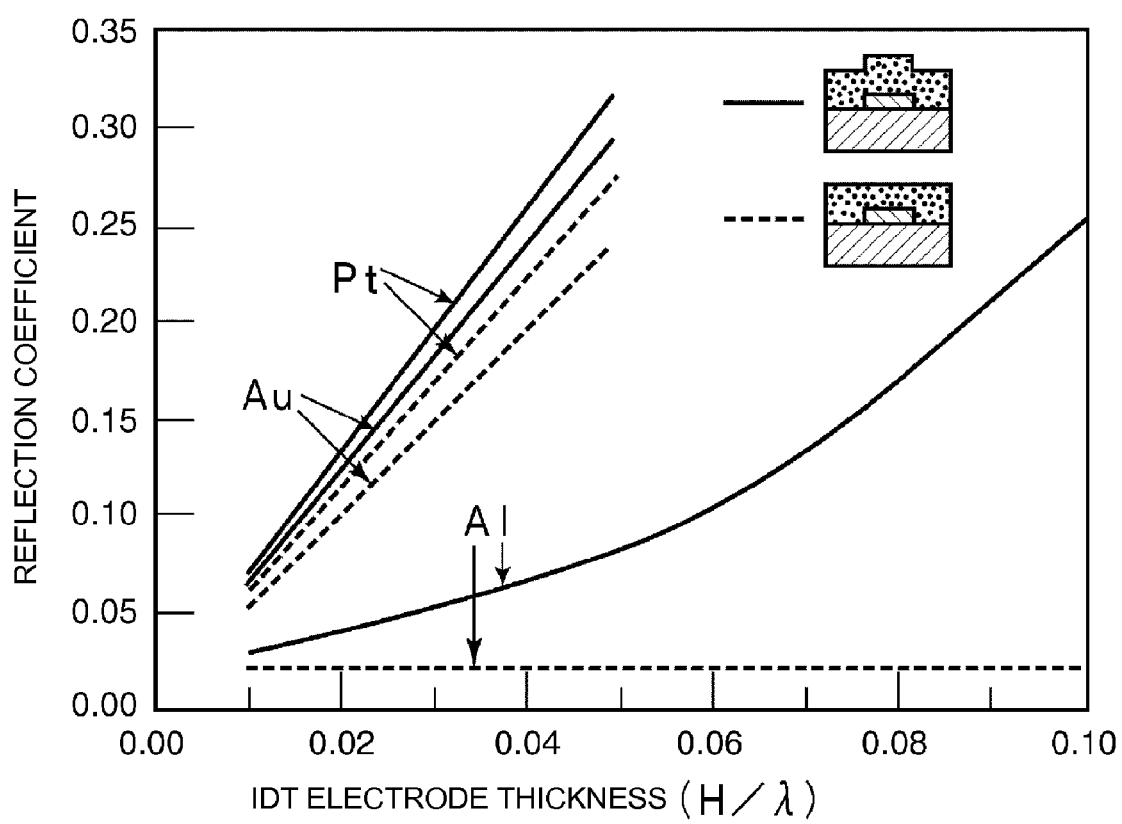
FIG. 2 is a graph showing the relationship between the reflection coefficient and the electrode thickness of a one-port type surface acoustic wave device in which an IDT electrode made of Al, Au, or Pt is formed on a $LiTaO_3$ substrate of Euler angles (0°, 126°, 0°) to have various thicknesses, and a $SiO_2$ film having a normalized thickness $Hs/\lambda$ of about 0.2 is further formed. The relationship is obtained for instances in which the surface of the $SiO_2$ film is planarized and in which the surface thereof is not planarized.
Figure 3:
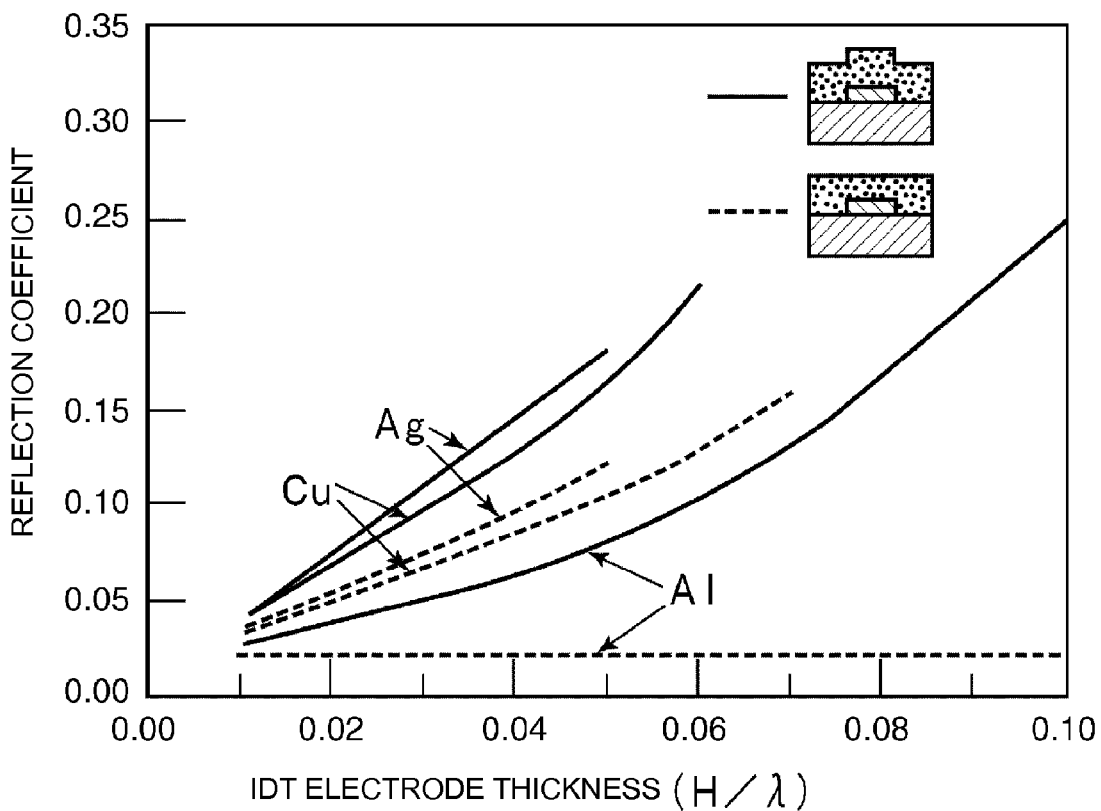
FIG. 3 is a graph showing the relationship between the reflection coefficient and the electrode thickness of a one-port type surface acoustic wave device in which an IDT electrode made of Cu or Ag is formed on a $LiTaO_3$ substrate of Euler angles (0°, 126°, 0°) to have various thicknesses, and a $SiO_2$ film having a normalized thickness $Hs/\lambda$ of about 0.2 is further formed. The relationship is obtained for situations in which the surface of the $SiO_2$ film is planarized and in which the surface thereof is not planarized.

FIG. 1 is a schematic, front, cross-sectional view of a surface acoustic wave device according to a first preferred embodiment of the present invention. The electrode structure of the surface acoustic wave device of this preferred embodiment is preferably equivalent to that of the surface acoustic wave device 11 described above. That is, the electrode structure shown in FIG. 4 is also provided in the surface acoustic wave device of this preferred embodiment. Thus, FIG. 4 is also a schematic front view illustrating the electrode structure of the surface acoustic wave device of this preferred embodiment. However, in FIG. 4, a SiN layer which will be described later is omitted.

A surface acoustic wave device 21 of this preferred embodiment is formed in a similar manner to that of the above surface acoustic wave device 11 except that a SiN layer 22 is provided at the topmost portion.

That is, as shown in FIG. 1, the surface acoustic wave device 21 includes a piezoelectric substrate 1 formed from a 36° rotated Y-plate X-propagation $LiTaO_3$ substrate. On the piezoelectric substrate 1, the IDT electrode 4A is formed. More particularly, as the electrode, the IDT electrode 4A is provided and the reflectors 12 and 13 are disposed at two sides of the IDT electrode 4A in the surface acoustic wave propagation direction. That is, in order to define a one terminal-pair surface acoustic wave resonator, the IDT electrode 4A and the reflectors 12 and 13 are provided. The IDT electrode 4A has a pair of comb electrodes each having a plurality of electrode fingers, and the electrode fingers of said pair of the comb electrodes are interdigitated with each other. In addition, the reflectors 12 and 13 each include electrode fingers that are short-circuited at two ends of the reflector.

With reference to FIG. 1, in regions other than those at which the electrode is provided, the first $SiO_2$ layer 2 is provided.

In addition, the thickness of the first $SiO_2$ layer 2 is set to be approximately equal to that of the electrode. Thus, the upper surface of the structure including the electrode and the first $SiO_2$ layer 2 is planarized, as in the case of the above-described reference example. In other words, the upper surface of the electrode and the upper surface of the first $SiO_2$ layer 2 are disposed at approximately the same height.

The second $SiO_2$ layer 6 is disposed so as to cover the electrode and the first $SiO_2$ layer 2.

When the second $SiO_2$ layer 6 is formed using a thin-film forming method such as sputtering, the upper surface of the second $SiO_2$ layer 6 is formed so as to be flat. That is, since the upper surface of the first $SiO_2$ layer 2 and that of the electrodes are disposed at approximately the same height, when the second $SiO_2$ layer 6 is formed by a thin-film forming method, the upper surface of the second $SiO_2$ layer 6 has an approximately flat surface, and as a result, the generation of undesired ripples is effectively eliminated.

In addition, with the various planarization methods described above, the upper surface of the second $SiO_2$ layer 6 may also be planarized. The meaning of the planarization is the same as that described above.

In addition, as described with reference to FIG. 26, the thickness h/λ of the second $SiO_2$ layer 6 covering the electrode is preferably set in the range of about 0.08 to about 0.5 in accordance with the results shown in FIG. 26, and as a result, the absolute value of the amount of change in frequency-temperature properties TCF is decreased to about 20 ppm/° C. or less.

As described above, the surface acoustic wave device 21 is substantially the same as the surface acoustic wave device 11 described in the reference example, except for the SiN layer 22. That is, in the surface acoustic wave device 21, the electrode is formed of (1) a metal having a density greater than that of Al or an alloy primarily formed of the metal, or is formed of (2) a laminate film including a metal layer as a major metal layer, which is composed of a metal having a density greater than that of Al or an alloy primarily formed of the metal, and a metal layer made of another metal and provided on the major metal layer. In addition, the density of the electrode is set to be at least about 1.5 times the density of the first $SiO_2$ layer 2. Thus, in the surface acoustic wave device 21 of this preferred embodiment, the same function and advantage as that obtained by the surface acoustic wave device 11 of the above reference example are obtained.

In the surface acoustic wave device 21 of this preferred embodiment, the SiN layer 22 is disposed so as to cover the second $SiO_2$ layer 6. In this preferred embodiment, the SiN layer 22 is preferably defined by a SiN film. The SiN layer 22 is made of a material having an acoustic velocity different from that of the second $SiO_2$ layer 6. In addition to the above-described function and advantage obtained by the surface acoustic wave device 11 in which the surface of the second $SiO_2$ layer 6 is planarized, the fractional band width (fa−fc)/fc (%) is increased in the surface acoustic wave device 21 according to this preferred embodiment. In the fractional band width, fc indicates a resonant frequency, and fa indicates an antiresonant frequency. In addition, since the resistance at the antiresonant frequency fa, that is, antiresonant resistance Ra, is increased, Q at the antiresonant frequency fa is increased, and for example, in a band pass filter including a plurality of the surface acoustic wave devices 21, the attenuation amount in the attenuation region at a high frequency side of the pass band is increased, such that the steepness of the filter properties is increased.

The above-described functions and advantages of the surface acoustic wave device 21 of this preferred embodiment will be described with reference to more particular experimental examples.

A $SiO_2$ film having a thickness h/λ of about 0.04 and the first $SiO_2$ layer 2 were formed over the entire surface of a 36° rotated Y-plate X-propagation $LiTaO_3$ substrate used as the piezoelectric substrate 1. The formation of the $SiO_2$ film may be performed by an optional method such as printing, deposition, or sputtering. However, in this preferred embodiment, the formation was performed by sputtering.

Next, by using a photolithographic technique, the $SiO_2$ film was patterned. Patterning was performed so as to remove the $SiO_2$ film provided in the region at which the electrode was formed.

Next, a Ti film having a thickness h/λ of about 0.0025 and a Cu film having a thickness h/λ of about 0.0325 were sequentially formed. The total thickness h/λ of the Ti film and the Cu film was about 0.035.

Subsequently, the Ti film and the Cu film disposed on the resist pattern provided on the $SiO_2$ film were removed. As described above, the first $SiO_2$ layer 2 and the electrode were formed.

Next, by sputtering, a $SiO_2$ film was formed over the entire surface, such that the second $SiO_2$ layer 6 was formed. Finally, a SiN film was formed by sputtering, such that the SiN layer 22 was formed. In the surface acoustic wave device 21 obtained as described above, after the frequency properties are measured, frequency adjustment is performed by machining the SiN layer 22. This frequency adjustment will be described with reference to FIG. 5. The data including the frequency properties shown in FIG. 5, and other figures, are properties obtained when a one-port type surface acoustic wave resonator for a 1.9 GHz band was formed which had the electrode structure shown in FIG. 4.

Figure 5:
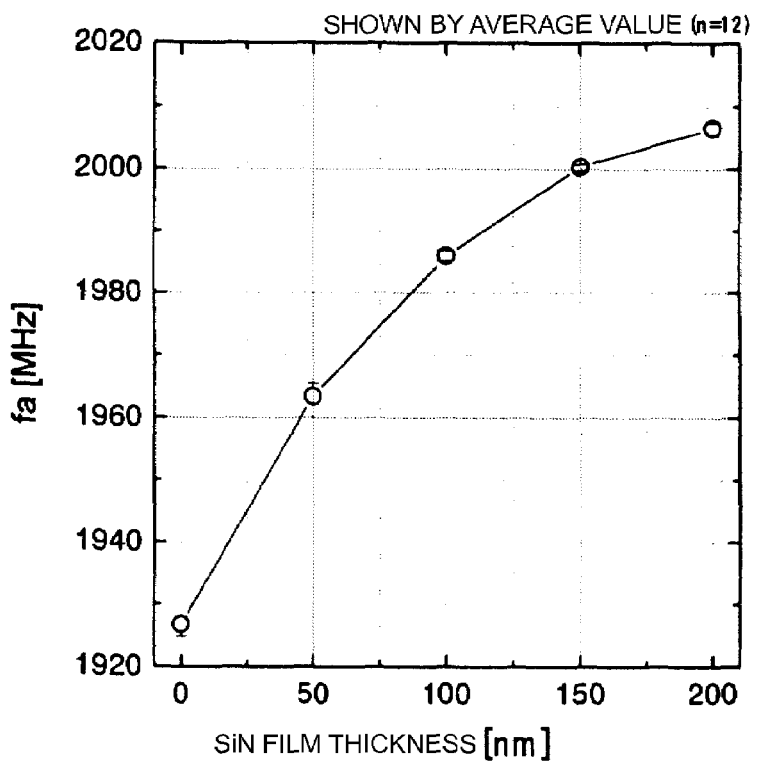
FIG. 5 is a graph showing the change in a resonant frequency fa when the thickness of a SiN film is changed in the surface acoustic wave device of the first preferred embodiment of the present invention.

FIG. 5 is a graph showing the change in antiresonant frequency fa when the thickness of a SiN layer 22 of the surface acoustic wave device 21 is changed.

In general, in the surface acoustic wave device 21, when the thickness of the laminate film made of the $SiO_2$ film and the SiN film is increased, the insertion loss is increased, and the frequency properties are significantly degraded. However, in this preferred embodiment, since the upper surface of the second $SiO_2$ layer 6 is planarized as described above, the degradation in properties caused by the increase in thickness of the laminate film is eliminated and minimized.

As shown in FIG. 5, when the thickness of the SiN film is changed, the antiresonant frequency fa is substantially changed. Thus, when the thickness of the SiN layer 22 is decreased, for example, using reactive ion etching or physical etching by irradiation of inert ions such as Ar or $N_2$, the frequency is easily adjusted. Alternatively, when the SiN film is further formed by sputtering so as to increase the thickness of the SiN layer 22, the frequency adjustment may also be performed so as to increase the frequency.

The frequency adjustment performed by the thickness adjustment of the SiN layer 22 as described above can be easily performed at a mother wafer stage to obtain the surface acoustic wave device 21. In addition, when the frequency adjustment is performed so as to decrease the thickness of the SiN layer 22 using, for example, reactive ion etching or physical etching by irradiation of inert ions such as Ar or $N_2$, the frequency adjustment can be performed when the surface acoustic wave device 21 is mounted on a package.

The surface acoustic wave device 11 of the reference example had the same structure as that of this preferred embodiment, except that the SiN layer 22 was not formed on the second $SiO_2$ layer 6. In the surface acoustic wave device 11 of the reference example, by adjusting the thickness of the second $SiO_2$ layer 6, the frequency is adjusted. However, since the SiN layer 22 was not provided, when the frequency was adjusted by adjusting the thickness of the second $SiO_2$ layer 6, the frequency-temperature coefficient TCF (ppm/° C.) and the fractional band width were substantially changed. On the other hand, in this preferred embodiment, the frequency adjustment is performed by adjusting the thickness of the SiN layer 22, and in this case, the change in frequency-temperature coefficient TCF and that in fractional band width are suppressed. These effects will be described with reference to FIGS. 6 and 7. The change in the fractional band width is produced by the variation in electromechanical coefficient caused by the thickness adjustment.

Figure 6:
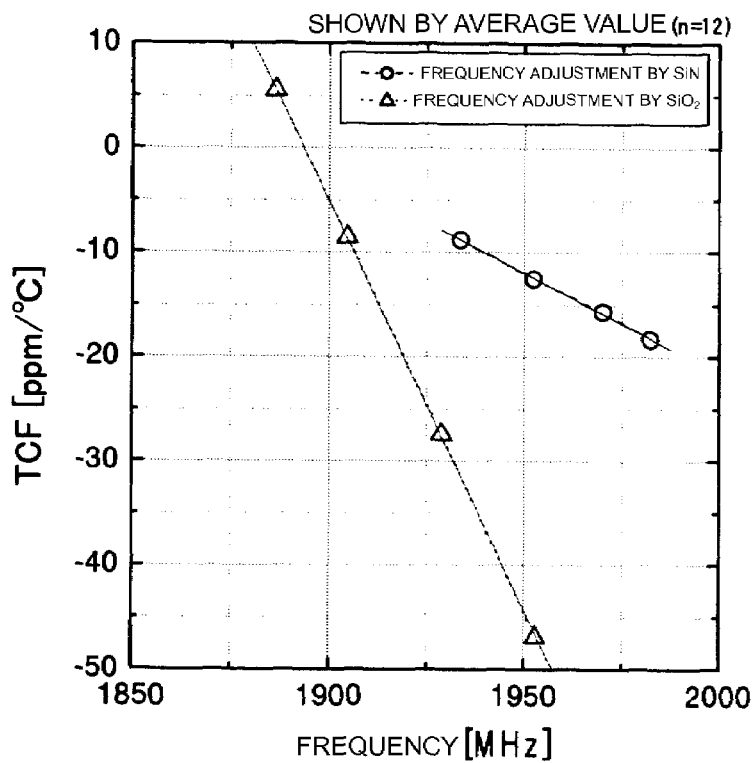
FIG. 6 is a graph showing the relationship between the frequency and the frequency-temperature properties obtained when frequency adjustment is performed by adjusting the thickness of a SiN film in a surface acoustic wave device of this preferred embodiment, and showing the above relationship obtained when frequency adjustment is performed by adjusting the thickness of a $SiO_2$ film of a surface acoustic wave device prepared for comparison.
Figure 7:
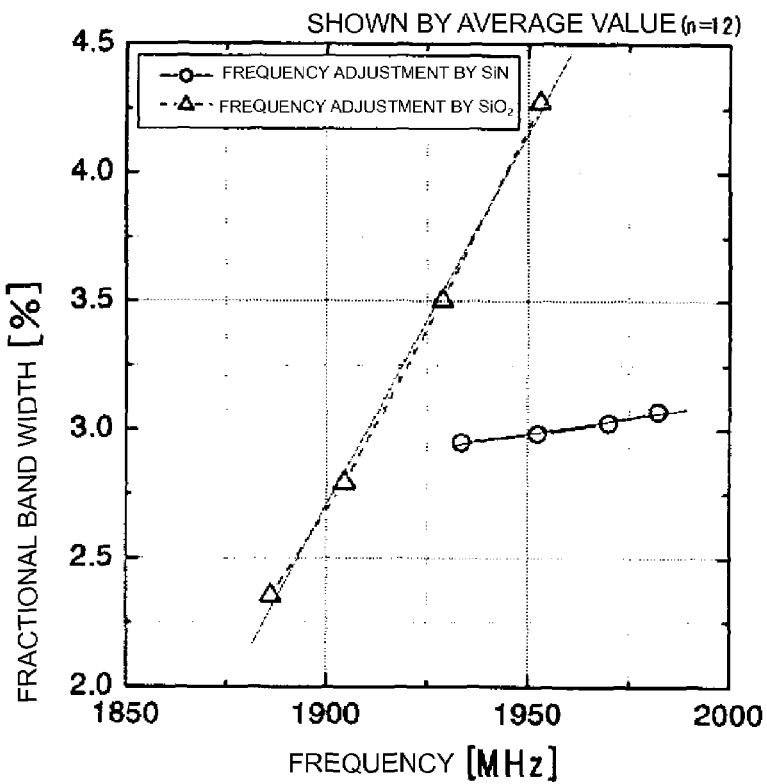
FIG. 7 is a graph showing the relationship between the frequency and the fractional band width obtained when frequency adjustment is performed by adjusting the thickness of the SiN film in the surface acoustic wave device of the first preferred embodiment, and showing the above relationship obtained when frequency adjustment is performed by adjusting the thickness of a $SiO_2$ film of a surface acoustic wave device prepared for comparison.

FIG. 6 is a graph showing the change in frequency-temperature properties with the change in frequency when the frequency adjustment is performed by the thickness adjustment of the SiN film in this preferred embodiment, and when the frequency adjustment is performed by the thickness adjustment of the $SiO_2$ film in the surface acoustic wave device 11 of the reference example, and FIG. 7 is a graph showing the change in fractional band width with the change in frequency.

As shown in FIGS. 6 and 7, in the surface acoustic wave device 11, when the frequency is adjusted by the thickness adjustment of the second $SiO_2$ layer 6, the frequency-temperature coefficient TCF and the fractional band width are substantially changed. On the other hand, in the surface acoustic wave device 21 of this preferred embodiment, when the frequency is adjusted by the thickness adjustment of the SiN layer 22, the frequency-temperature coefficient TCF and the fractional band width are not substantially changed.

Thus, as described above, since the SiN layer 22 is provided in this preferred embodiment, the frequency adjustment is performed without causing considerable changes in fractional band width and frequency-temperature TCF. In particular, as shown in FIG. 6, when h/λ is set so as to satisfy an equation, $0 < h/\lambda \leq 0.1$, in which the wavelength of a surface acoustic wave is represented by h, the amount of change in frequency-temperature properties TCF is controlled to be about 10 ppm/° C. or less.

In this preferred embodiment, since the layer 22 is formed of SiN, reactive ion etching thereof can be performed with a gas similar to that used for $SiO_2$ forming the second $SiO_2$ layer 6. Thus, in addition to the thickness adjustment of the SiN layer 22 which is easily performed by reactive ion etching, a step of removing an insulating film provided on electrode pads, which are necessarily exposed for electrical connection of the electrode with the exterior, is easily performed.

Figure 8:
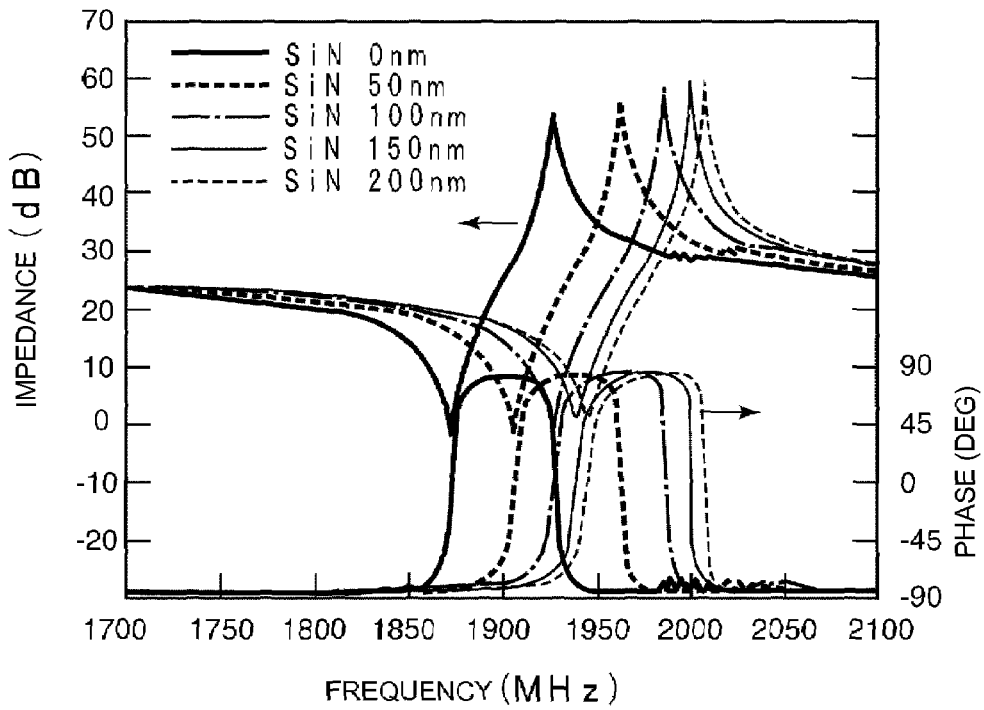
FIG. 8 is a graph showing the changes in impedance-frequency properties and phase-frequency properties of the surface acoustic wave device when the thickness of the SiN film is increased in the first preferred embodiment of the present invention.
Figure 9:
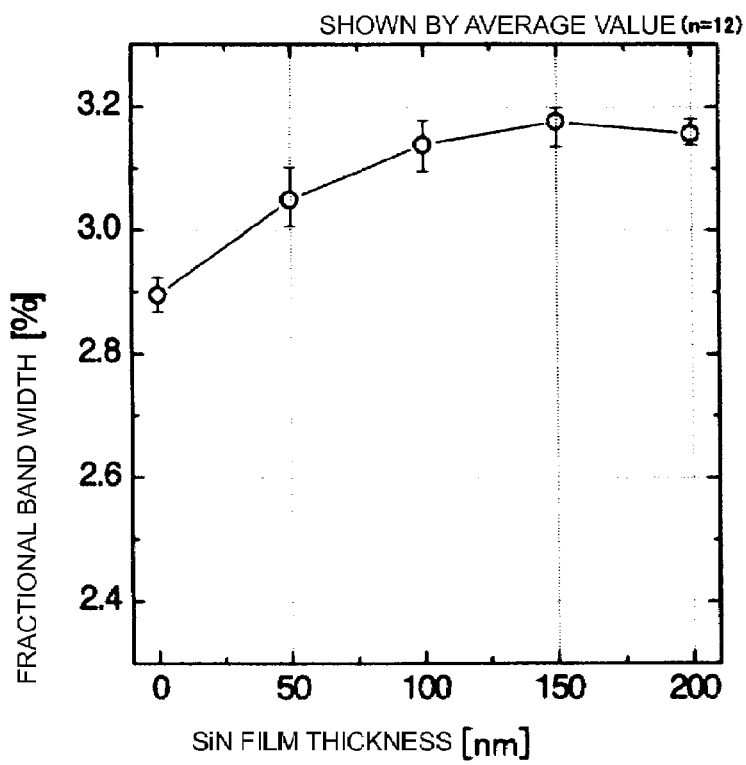
FIG. 9 is a graph showing the change in fractional band width when the thickness of the SiN film is changed in the first preferred embodiment of the present invention.

Next, in the surface acoustic wave device 21 of this preferred embodiment, the change in frequency properties with the change in thickness of the SiN layer 22 is shown in FIG. 8. In addition, FIGS. 9 and 10 show the changes in fractional band width and antiresonant resistance Ra in response to changes in the thickness of the SiN film.

As shown in FIG. 8, the resonant frequency fr and the antiresonant frequency fa are increased as the thickness of the SiN film is increased from about 0 to about 200 nm. In addition, as shown in FIG. 9, as the thickness of the SiN layer 22 is increased, the fractional band width is increased. In particular, when the thickness of the SiN layer 22 is in the range of about 100 nm to about 200 nm, that is, when h/λ is set in the range of about 0.05 to about 0.1, the fractional band width is increased to at least about 3.1%.

Figure 10:
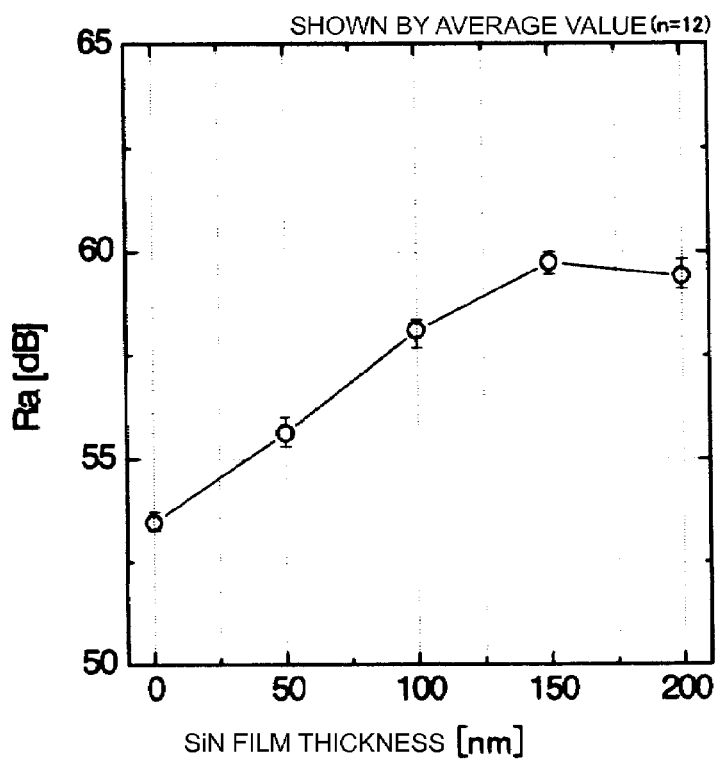
FIG. 10 is a graph showing the change in antiresonant resistance Ra when the thickness of the SiN film is changed in the first preferred embodiment of the present invention.

In addition, as shown in FIG. 10, the antiresonant resistance Ra increases as the thickness of the SiN film increases, and thereby Q at the antiresonant frequency is increased. Thus, in a band pass filter including this surface acoustic wave device 21, the steepness of the filter properties at a high frequency region of the pass band are effectively increased.

In particular, when the thickness of the SiN film is in the range of about 100 nm to about 200 nm, that is, when the normalized thickness h/λ is in the range of about 0.05 to about 0.1, the antiresonant resistance Ra is at least about 57.5 dB, and when the thickness is about 150 nm, that is, when the normalized thickness h/λ is about 0.075, the antiresonant resistance Ra is maximally increased to about 60 db.

In this preferred embodiment, the surface of the second $SiO_2$ layer 6 is planarized, and the SiN layer 22 is formed on the upper surface of the second $SiO_2$ layer 6, such that the properties are improved as described above. The effect obtained by the formation of the SiN layer 22 is based on the planarization of the surface of the second $SiO_2$ layer 6 as described above. The above effect will be described with reference to FIGS. 11 to 13.

Figure 11:
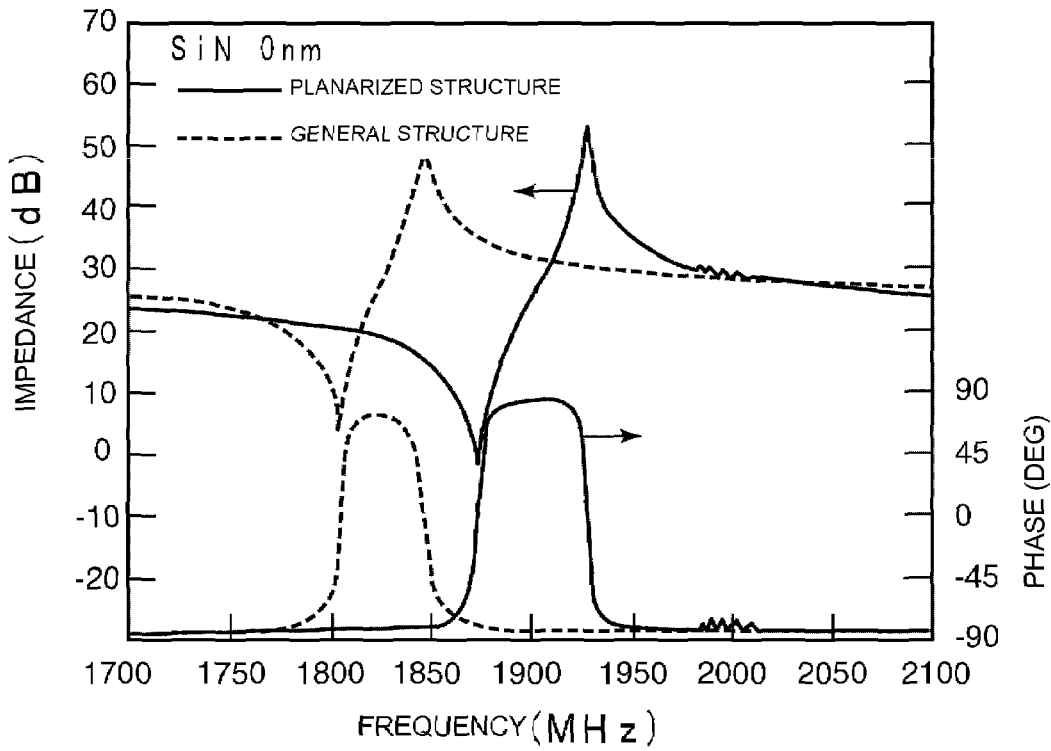
FIG. 11 is a graph showing the impedance-frequency properties and the phase-frequency properties of a surface acoustic wave device of a reference example in which the surface of an insulating layer of $SiO_2$ is planarized, the reference example being based on the first preferred embodiment, and showing the above properties of a surface acoustic wave device in which the surface of a second $SiO_2$ layer is not planarized.

FIG. 11 is a graph showing the frequency properties of the surface acoustic wave device of this preferred embodiment, which are obtained before the SiN layer 22 is formed, and for comparison purposes, showing the frequency properties of a surface acoustic wave device formed in a manner similar to that described above, except that the upper surface of the $SiO_2$ film is not planarized. When the surface acoustic wave device used for comparison purposes was formed, after the electrode was formed, a $SiO_2$ film having a thickness of about 400 nm (h/λ equal to about 0.2) was formed by sputtering. That is, the first $SiO_2$ layer 2 and the second $SiO_2$ layer 6 were not separately formed, and the surface acoustic wave device used for comparison purposes was formed by forming a $SiO_2$ film having a thickness of about 400 nm (h/λ equal to about 0.2). As shown in FIG. 11, when the planarization is performed, the resistance at the antiresonant frequency, that is, the antiresonant resistance, and the fractional band width are increased.

Figure 12:
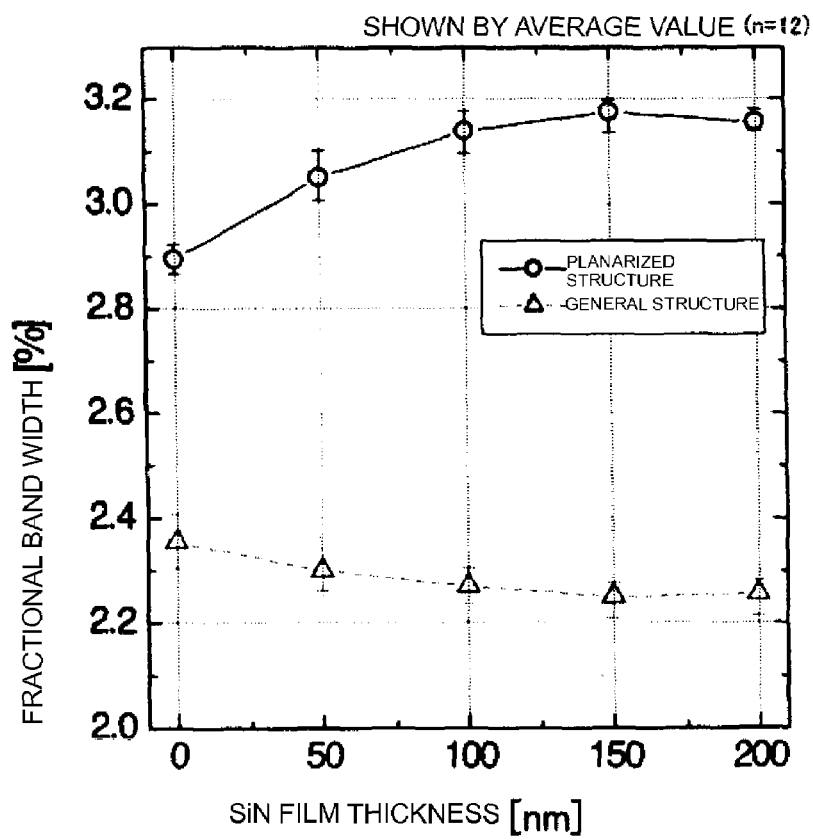
FIG. 12 is a graph showing the relationship between the fractional band width and the thickness of SiN obtained when the thickness of a SiN film is changed in this preferred embodiment in which the surface of a second $SiO_2$ layer made of $SiO_2$ is planarized, and showing the above relationship obtained when the thickness of a SiN film of a surface acoustic wave device prepared for comparison is changed in which the surface of a second $SiO_2$ layer in not planarized.
Figure 13:
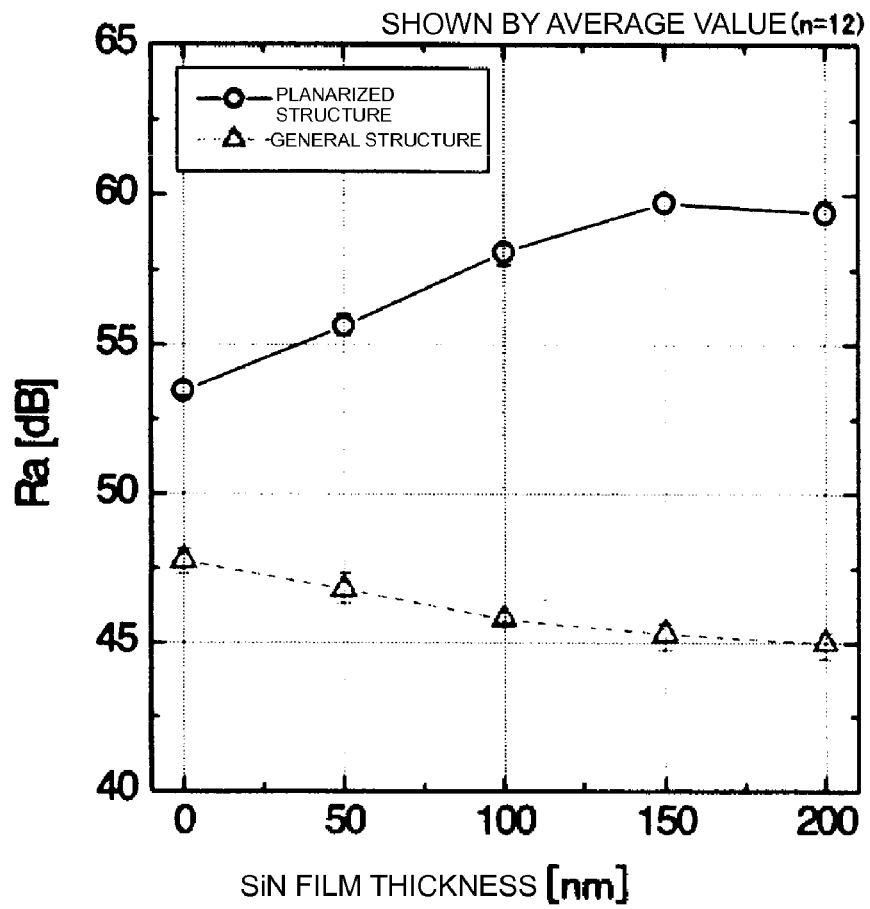
FIG. 13 is a graph showing the relationship between antiresonant resistance Ra and the thickness of SiN obtained when the thickness of a SiN film is changed in this preferred embodiment in which the surface of a second $SiO_2$ layer made of $SiO_2$ is planarized, and showing the above relationship obtained when the thickness of a SiN film of a surface acoustic wave device prepared for comparison is changed in which the surface of a second $SiO_2$ layer is not planarized.

As in the above-described preferred embodiment, the SiN film was formed so as to have various thicknesses, and the fractional band width and the antiresonant resistance Ra were measured. The results are shown in FIGS. 12 and 13. As shown in FIGS. 12 and 13, in this preferred embodiment, with the formation of the SiN layer 22 from the SiN film and the increase in thickness of the SiN film, the increase in fractional band width and the improvement in antiresonant resistance Ra are achieved. However, in the comparative example in which the upper surface of the second $SiO_2$ layer 6 is not planarized, even when the SiN film is formed, the properties are not improved. In particular, when the thickness of the SiN film is increased, the properties are further degraded.

Figure 34:
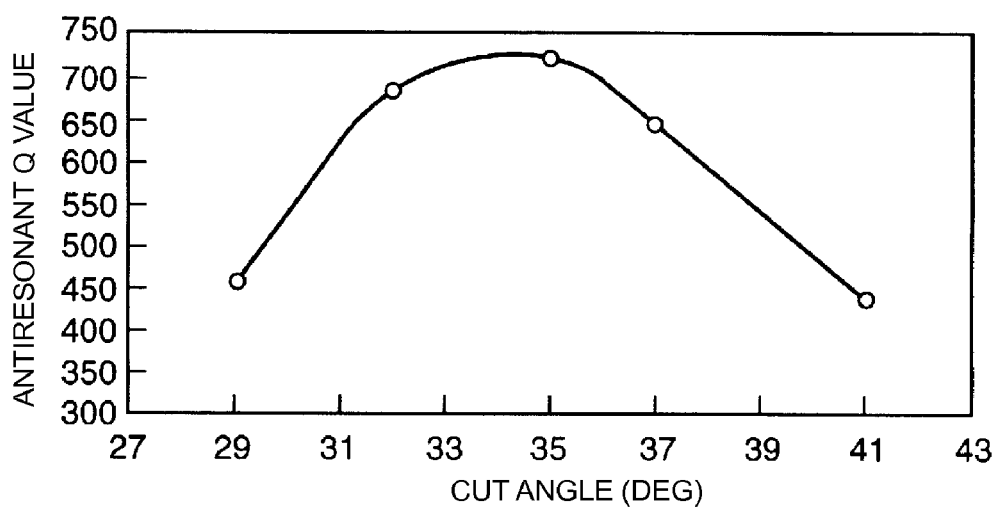
FIG. 34 is a graph showing one example of the change in antiresonant Q value when the cut angle of a $LiTaO_3$ substrate is changed in the surface acoustic wave device according to the first preferred embodiment of the present invention.

In addition, as in the above-described preferred embodiment, various surface acoustic wave devices 21 were formed while the thickness of the second $SiO_2$ layer 6, the thickness of the SiN film 22, and the cut angle of the piezoelectric substrate are varied, and the change in antiresonant Q value with the change in cut angle of the piezoelectric substrate was measured. One example of the change in antiresonant Q value with the cut angle is shown in FIG. 34. In FIG. 34, the change in antiresonant Q value of the surface acoustic wave device 21 is shown, which is obtained when the normalized thickness of the second $SiO_2$ layer 6 is set to about 0.28, the normalized thickness of the SiN layer 22 is set to about 0.075, and the cut angle of the piezoelectric substrate made of $LiTaO_3$ is changed.

As shown in FIG. 34, when the cut angle is in the range of 34±5°, the antiresonant Q value is preferably high, such as at least approximately 500.

Figure 35:
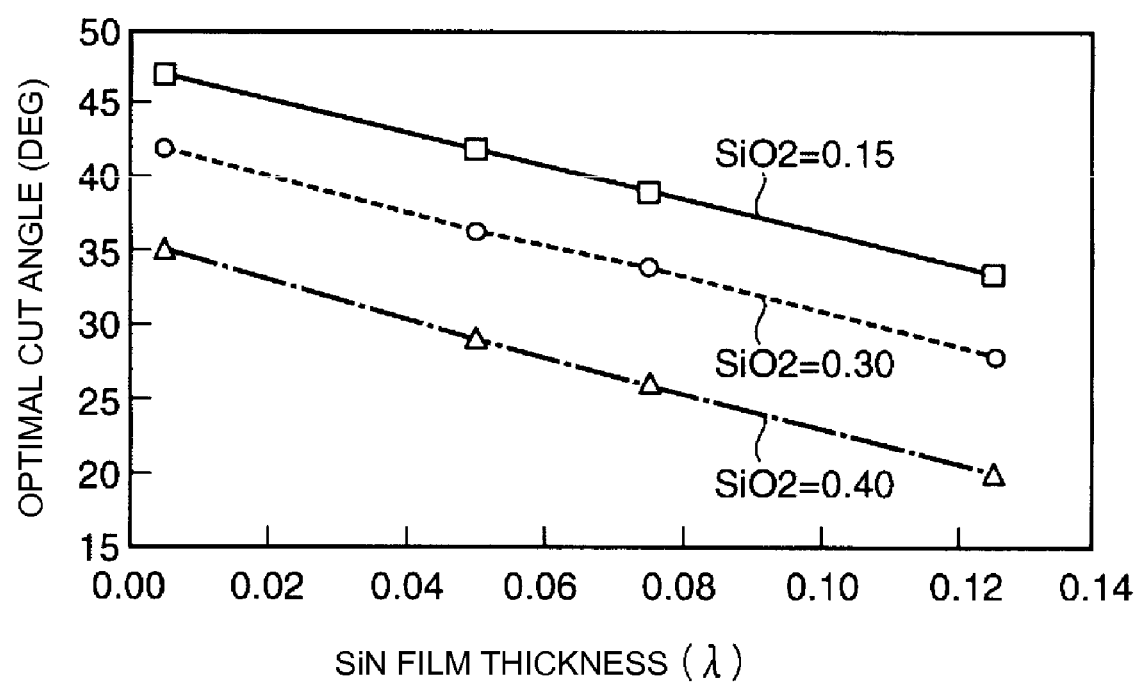
FIG. 35 is a graph showing the change in optimum cut angle at which antiresonance Ra is regarded as a superior value when the thickness of a SiN film forming a SiN layer is changed at which the normalized thickness of a $SiO_2$ film forming a second $SiO_2$ layer is set to 0.15, 0.30, and 0.40 in the first preferred embodiment of the present invention.

As shown in FIG. 34, the relationship between the thickness of the SiN film and the range of the cut angle of the $LiTaO_3$ substrate is obtained at which an antiresonant Q value of at least approximately 500 is achieved. The results are shown in FIG. 35. That is, in FIG. 35, the change in optimal cut angle range with the change in thickness of the SiN film is shown when the normalized thickness of the second $SiO_2$ layer 6 is set to about 0.15, about 0.30, and about 0.40. When the results shown in FIG. 35 are approximated, a preferable cut angle range of a rotated Y-plate X-propagation $LiTaO_3$ substrate is θ±5° where $θ=(A_1H_1^2+A_2H_1+A_3)H_2+A_4H_1+A_5$ is satisfied.

In the above equation, coefficients $A_1$ to $A_5$ are as follows.
coefficient $A_1$=−190.48, coefficient $A_2$=76.19, coefficient $A_3$=−120.00, coefficient $A_4$=−47.30, coefficient $A_5$=55.25, $H_1=h_1/λ$, and $H_2=h_2/λ$.

In addition, $h_2$ indicates the thickness of the SiN layer, and $h_1$ indicates the thickness of the second $SiO_2$ layer 6.

Second Preferred Embodiment

Figure 14:
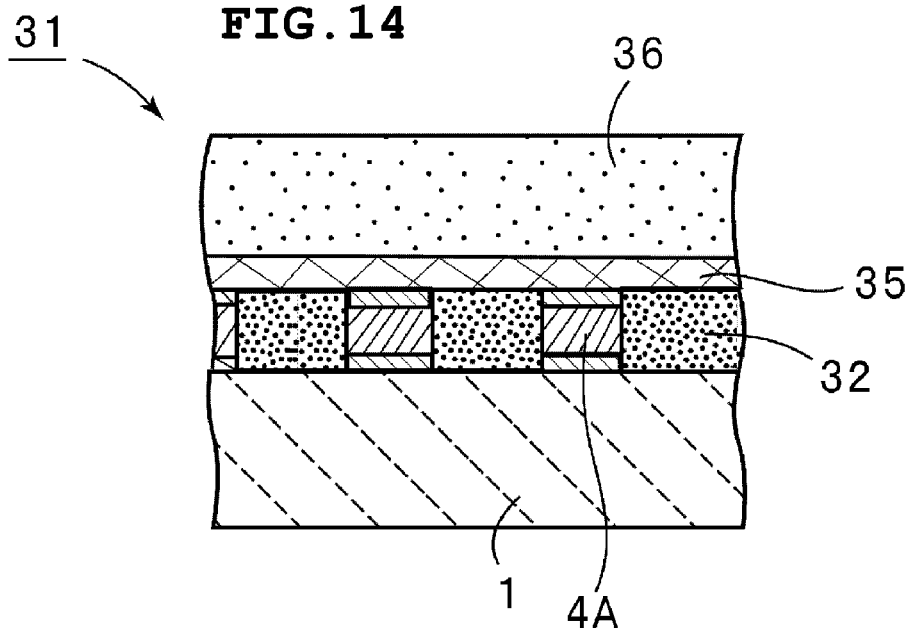
FIG. 14 is a schematic, partially cut-away, cross-sectional front view of a surface acoustic wave device of a second preferred embodiment according to the present invention.

FIG. 14 is a schematic, front, cross-sectional view of a surface acoustic wave device of a second preferred embodiment according to the present invention. In a surface acoustic wave device 31, the electrode is formed on the 36° rotated Y-plate X-propagation $LiTaO_3$ substrate 1. The electrode has a plane shape equivalent to that of the first preferred embodiment. That is, in this preferred embodiment, the electrode including the IDT electrode 4A and a pair of the reflectors 12 and 13 is arranged so as to define a one-port type surface acoustic wave device for a 1.9 GHz band.

In addition, the electrode includes a Ti film, a Cu film, and a Ti film having thicknesses of about 5 nm, about 65 nm, and about 10 nm, respectively. Then, a first $SiO_2$ layer 32 is provided so as to have a thickness of about 80 nm.

In this preferred embodiment, a diffusion inhibition film 35 is disposed so as to cover the electrode and the first $SiO_2$ layer 32. The diffusion inhibition film 35 is made of a SiN film in this preferred embodiment.

In addition, on the diffusion inhibition film 35, a second $SiO_2$ layer 36 is provided.

In this preferred embodiment, since the diffusion inhibition film 35 is made of SiN, diffusion of metal particles from the electrode to the second $SiO_2$ layer 36 is effectively eliminated and minimized.

When the surface acoustic wave device 31 of this preferred embodiment is manufactured, after the diffusion inhibition film 35 is formed, the second $SiO_2$ layer 36 is provided as a temperature property-improvement film by forming a $SiO_2$ film so as to improve the temperature properties, and subsequently, an insulating material on electrode pads of the electrode is removed by reactive ion etching to expose the electrode pads.

Figure 15A:
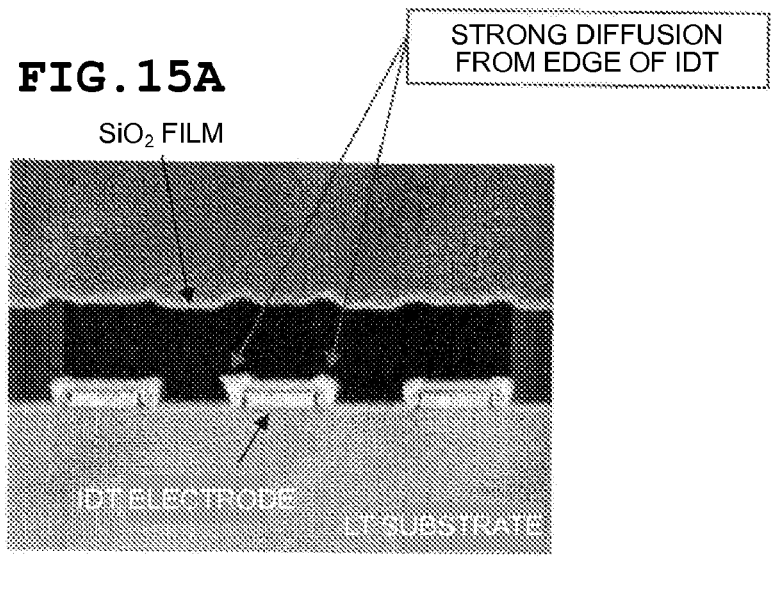
FIGS. 15A and 15B are a SIM photograph and a scanning electron microscopic photograph, respectively, the SIM photograph showing the state in which Cu as an electrode material diffuses from an IDT electrode when a SiN film is not formed as a diffusion inhibition film, the scanning electron microscopic photograph showing the state in which a void is generated because of the diffusion.
Figure 15B:
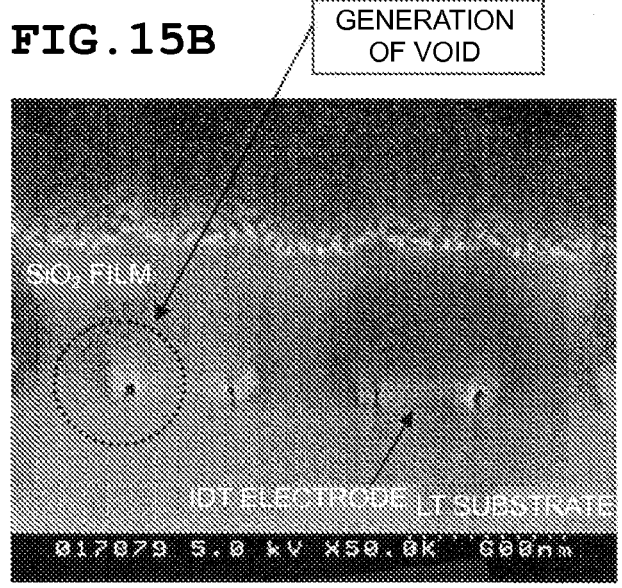

When the diffusion inhibition film 35 is not formed, while the second $SiO_2$ layer 36 is formed, an electrode material, Cu in this preferred embodiment, diffuses. As a result, as shown in FIGS. 15A and 15B, when the diffusion inhibition film 35 is not provided, due to the diffusion of Cu, voids are formed in the electrode and/or the flatness of the surface of the second $SiO_2$ layer 36 is degraded.

Figure 16A:
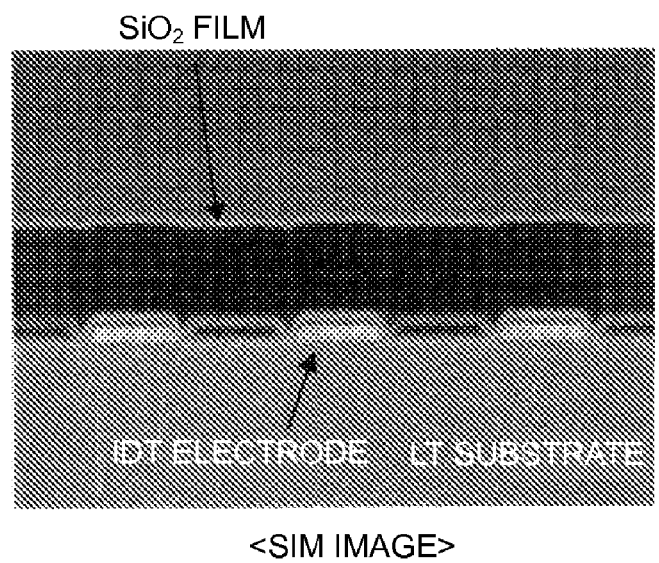
FIGS. 16A and 16B are a SIM photograph and a scanning electron microscopic photograph, respectively, each showing the state in which diffusion from an IDT electrode does not substantially occur in the second preferred embodiment in which a SiN film is formed as a diffusion inhibition film.
Figure 16B:
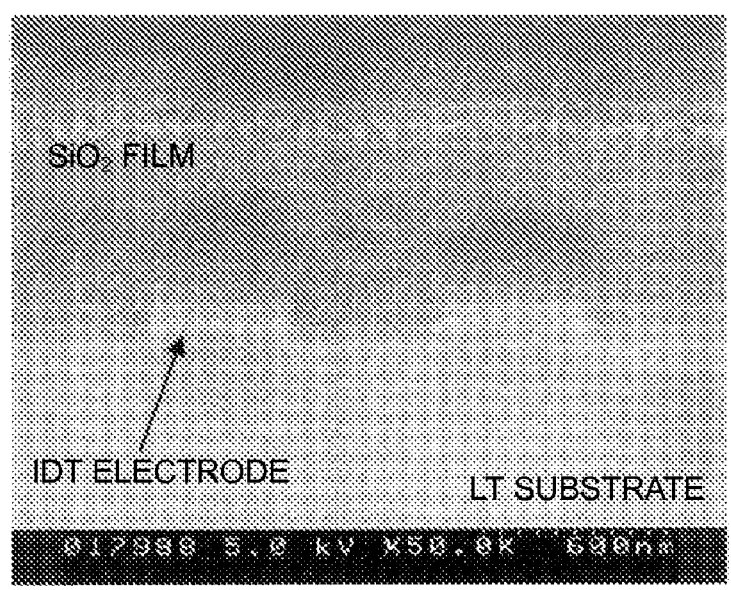
Figure 18A:
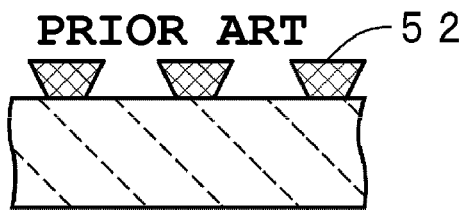
FIGS. 18A to 18D are schematic, partially cut-away, cross-sectional front views illustrating a conventional method for manufacturing a surface acoustic wave device.
Figure 18B:
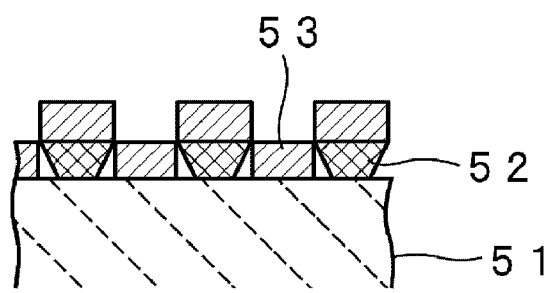
Figure 18C:
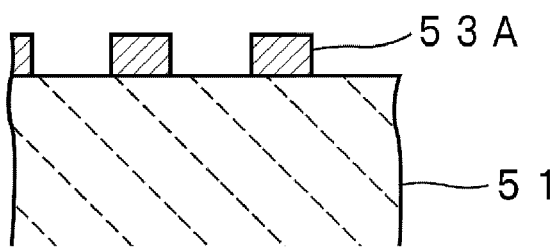
Figure 18D:
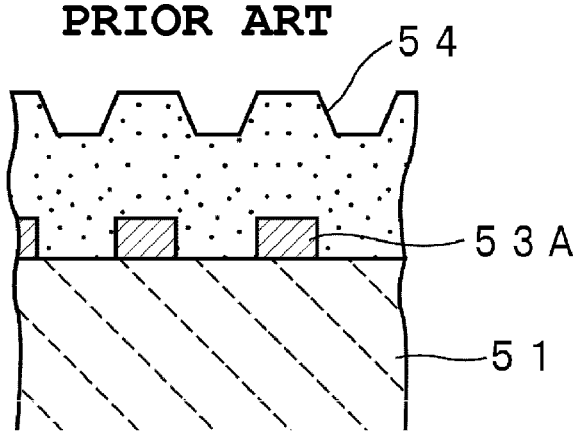
Figure 19:
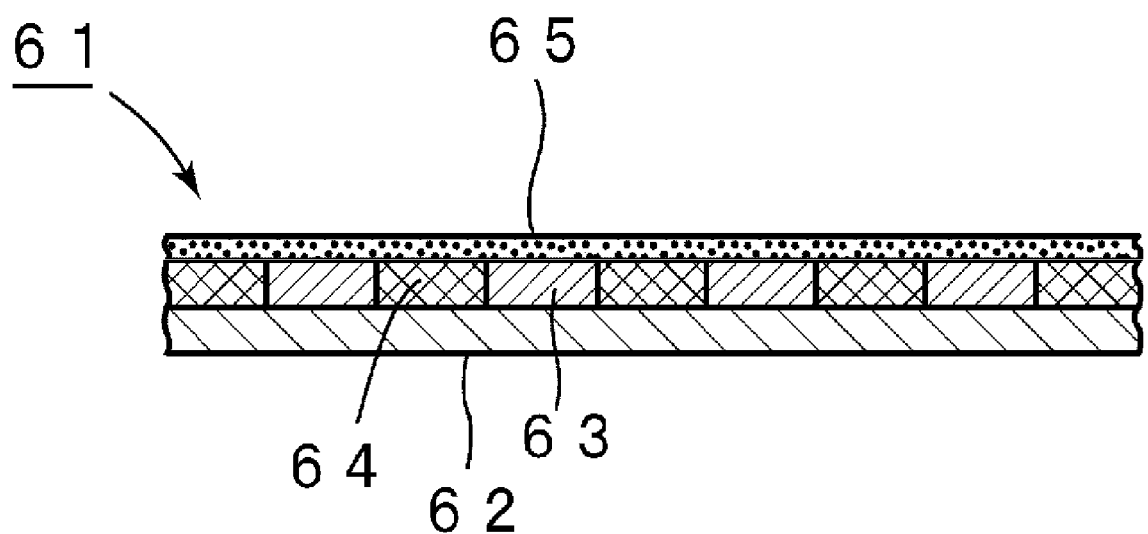
FIG. 19 is a partially cut-away, cross-sectional front view showing one example of a conventional surface acoustic wave device.

On the other hand, as shown in FIGS. 16A and 16B, in this preferred embodiment, since the diffusion inhibition film 35 made of SiN is formed, the diffusion of Cu of the electrode is eliminated and minimized. Thus, the generation of voids shown in FIG. 15B is prevented, and the flatness of the surface of the second $SiO_2$ layer 36 is improved.

Hereinafter, the above-described effects will be described with reference to particular experimental examples.

The following table 1 shows variations in properties of individual surface acoustic wave devices including a surface acoustic wave wafer having a diameter of about 10.16 cm, which were obtained for the surface acoustic wave device of the second preferred embodiment in which the diffusion inhibition film 35 is provided, and when a surface acoustic wave device is formed in a manner equivalent to that described above except that the diffusion inhibition film 35 is not provided. In this case, the thickness of the SiN film used as the diffusion inhibition film 35 was set to about 30 nm (h/λ=0.015).

TABLE 1

|  | Antiresonant Frequency (MHz) | | Antiresonant Resistance (dB) | | Fractional Band Width (%) | |
| --- | --- | --- | --- | --- | --- | --- |
|  | Average | Standard Deviation σ | Average | Standard Deviation σ | Average | Standard Deviation σ |
| With SiN Film | 1924.18 | 2.64 | 53.2 | 0.31 | 2.88 | 0.036 |
| Without SiN Film | 1934.61 | 1.53 | 53.4 | 0.11 | 2.85 | 0.021 |

As shown in Table 1, with the insertion of the diffusion inhibition film 35, the variation in properties, such as variation in frequency, is effectively prevented and minimized.

In addition, in this preferred embodiment, since the diffusion inhibition film 35 is made of SiN, reactive ion etching can be performed using a gas similar to that used for forming the first $SiO_2$ layer 32 and the second $SiO_2$ layer 36. Thus, the step of removing an insulating film on the electrode pads for exposure thereof is simplified.

In the second preferred embodiment, the surface acoustic wave device 31 is received in a package and is then wire-bonded and sealed, such that a surface acoustic wave device product is obtained. For the surface acoustic wave device product thus obtained, a high temperature load test was performed in which the product was maintained for approximately 600 hours under the following conditions.

High Temperature Load Test . . . While a direct current voltage of 6V was applied to a surface acoustic wave device product, the product was placed in a high temperature bath, and the insulating resistance was measured with time.

For comparison purposes, in a manner similar to the above-described experimental example, a high temperature load test was performed for a surface acoustic wave device product formed in a manner similar to that described above except that the diffusion inhibition film 35 was not provided. The results are shown in FIG. 17.

As shown in FIG. 17, in the experimental example in which the diffusion inhibition film 35 is provided, malfunction is unlikely to occur even after approximately 600 hours as compared to that of the comparative example having no diffusion inhibition film. In addition, as shown in Table 1, even when the diffusion inhibition film 35 is provided, the antiresonant resistance Ra and the fractional band width of the surface acoustic wave device are not degraded.

The thickness h of the diffusion inhibition film 35 made of SiN is preferably set so as to satisfy the equation $0.005 \leq h/\lambda \leq 0.05$, where λ indicates the wavelength of a surface acoustic wave. This will be described with reference to FIGS. 31 to 33 and Table 2 shown below.

Figure 31:
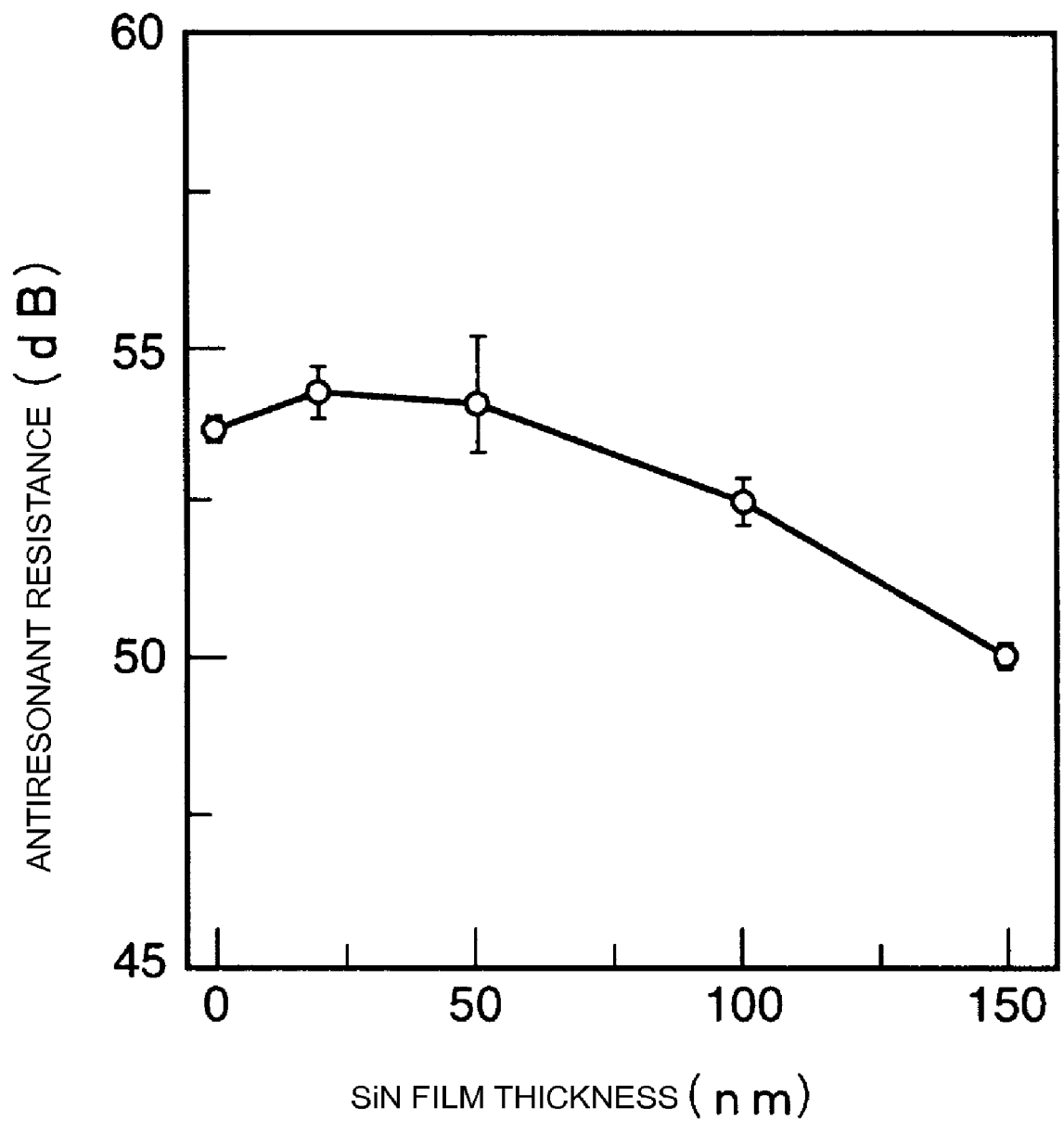
FIG. 31 is a graph showing the change in antiresonance Ra when the thickness of a SiN film used as a diffusion inhibition film is changed in an experimental example of the surface acoustic wave device according to the second preferred embodiment of the present invention.
Figure 32:
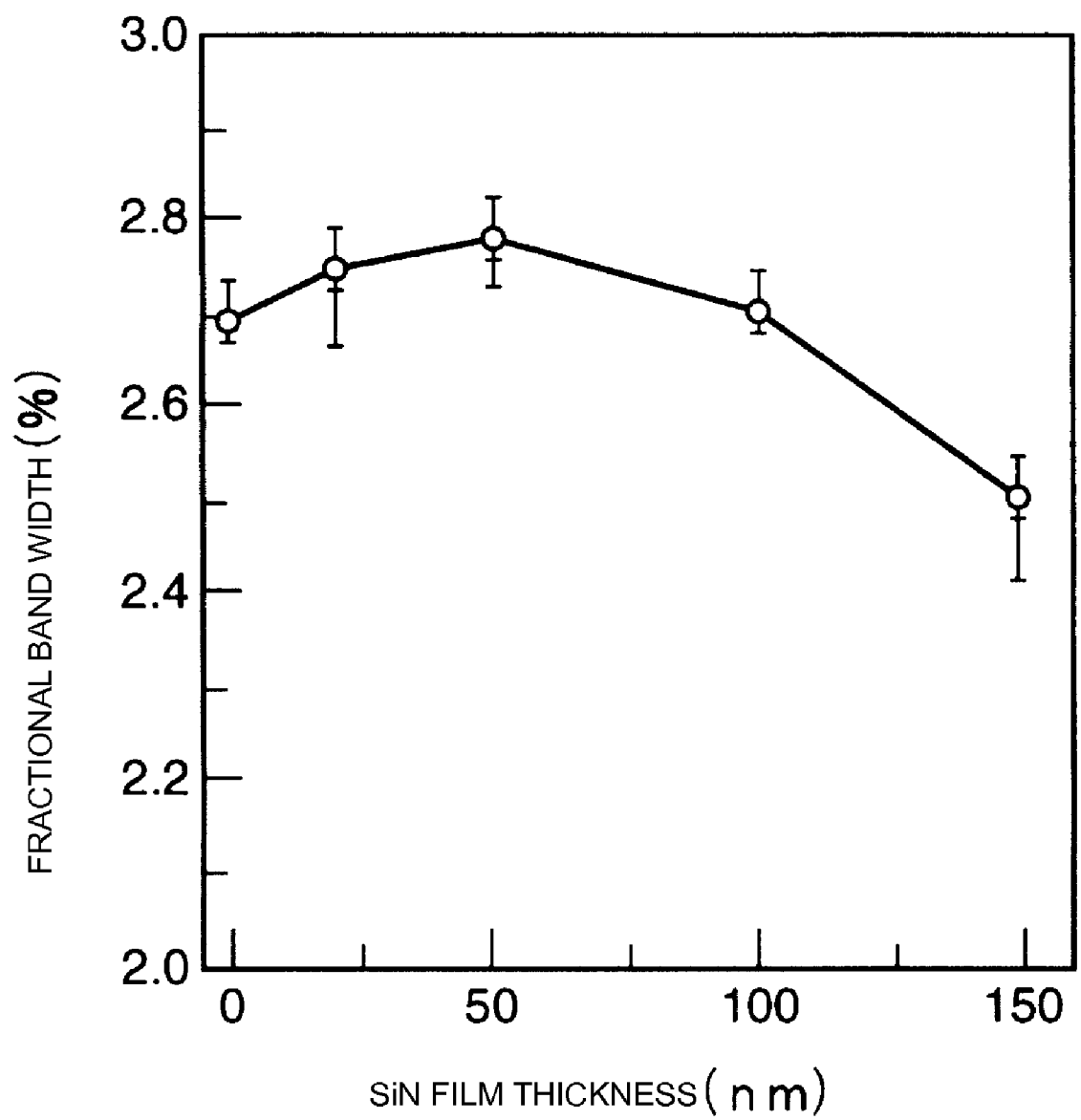
FIG. 32 is a graph showing the change in fractional band (%) of a filter when the thickness of a SiN film used as a diffusion inhibition film is changed in an experimental example of the surface acoustic wave device according to the second preferred embodiment of the present invention.
Figure 33:
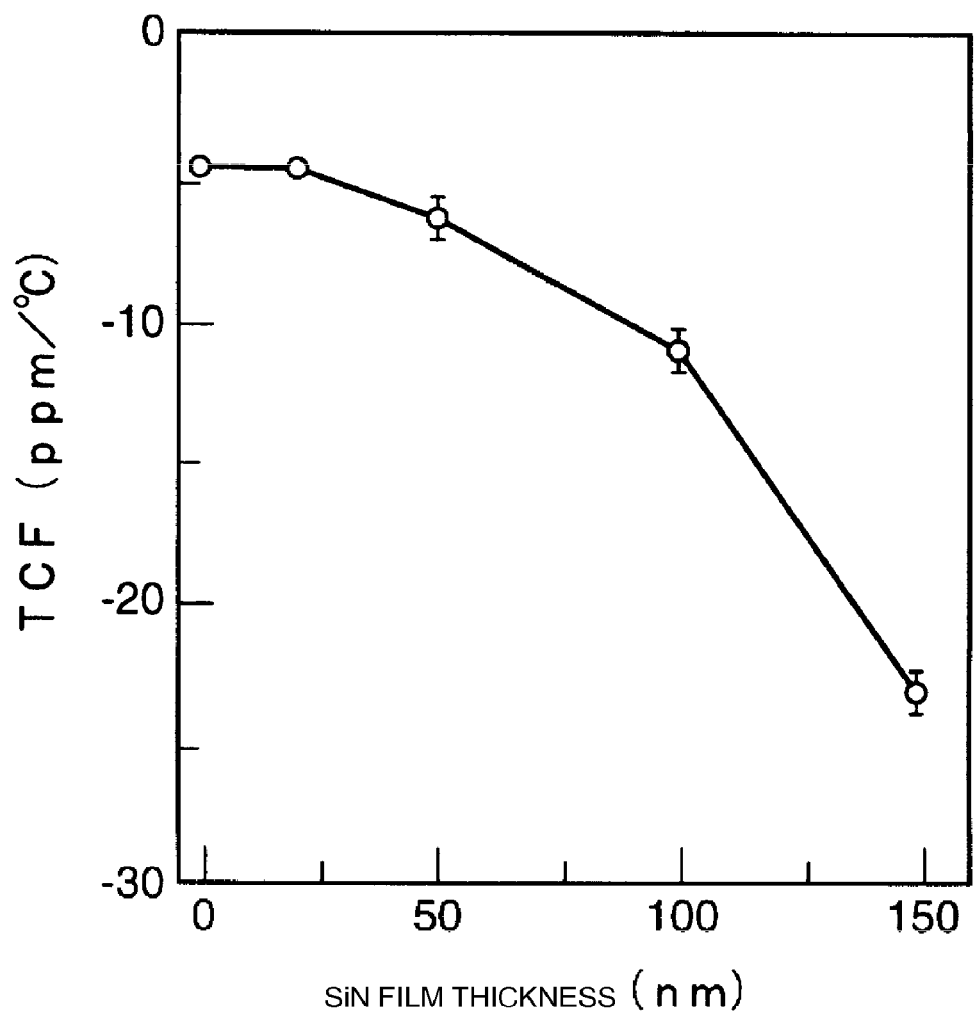
FIG. 33 is a graph showing the change in frequency-temperature properties TCF when the thickness of a SiN film used as a diffusion inhibition film is changed in an experimental example of the surface acoustic wave device according to the second preferred embodiment of the present invention.

That is, in the second preferred embodiment, various surface acoustic wave filter devices were formed by variously changing the thickness of the SiN film defining the diffusion inhibition film 35, and the properties were measured. FIGS. 31 to 33 are graphs showing the changes in antiresonant resistance, fractional band width of a filter, and temperature properties TCF at the resonant frequency, described above, which were obtained when the thickness of the SiN film was changed.

In addition, in the surface acoustic wave filter device of the second preferred embodiment described above, after individual surface acoustic wave devices 21 were formed in a manner similar to that described above except that the thickness of the SiN film was changed to about 5 nm, about 10 nm, and about 30 nm, and furthermore, the surface acoustic wave device 31 having no diffusion inhibition film was formed for comparison purpose, a high temperature load test was performed. The results are shown in Table 2 below.

In Table 2, ○ indicates no malfunctions (an insulating resistance of at least about $10^6 \Omega$), Δ indicates that although a suppression effect is observed, some are out of order, and x indicates that all show inferior resistance properties and are out of order.

TABLE 2

| Thickness of SiN Film (nm) | |
| --- | --- |
| 0 | X |
| 5 | Δ |
| 10 | ○ |
| 30 | ○ |

As shown in FIGS. 31 to 33 and the result shown in Table 2, when the thickness of the diffusion inhibition film 35 made of the SiN film is set in the range of about 10 nm to about 100 nm, that is, when the normalized thickness h/λ is set in the range of about 0.005 to about 0.05, the surface acoustic wave device 31 has stable temperature properties, such that the amount of change in TCF is about 10 ppm/° C. or less, and has superior resistance properties when a direct current voltage is applied.

In the second preferred embodiment, SiN is preferably used as the diffusion inhibition film 35. However, another nitride film may also be used. For example, AlN, TiN, TaN, or WN may be used. Furthermore, the diffusion inhibition film may be made of an oxide film, such as, for example, $Ta_2O_5$.

In addition, in FIG. 14, although the diffusion inhibition film 35 is disposed so as to cover the upper surface of the electrode, it may also be disposed so as to cover the side surfaces thereof, and in this case, it is preferable since the diffusion of the electrode material is more effectively prevented.

In addition, in the second preferred embodiment, the diffusion inhibition film 35 is provided between the electrode and the second $SiO_2$ layer 36, and the SiN layer 22 shown in the first preferred embodiment may also be formed on the second $SiO_2$ layer 36. The configuration described above is preferable since the effects of both of the first and the second preferred embodiments are obtained.

In the first and the second preferred embodiments, as the piezoelectric substrate, a 36° rotated Y-plate X-propagation $LiTaO_3$ substrate is used. However, a $LiTaO_3$ substrate having another cut angle may also be used, or another piezoelectric substrate, such as a $LiNbO_3$ substrate, may also be used.

In addition, in the above first and the second preferred embodiments, a one-port type surface acoustic wave resonator is described. However, the present invention can be applied to various general surface acoustic wave devices, including surface acoustic wave filters, such as a ladder type filter including a plurality of one-port type surface acoustic wave resonators as described above. In addition, instead of the one-port type surface acoustic wave resonator described above, the electrode may be formed so as to have various filter and resonator structures.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device comprising:
   a piezoelectric substrate made of one of $LiTaO_3$ or $LiNbO_3$ and having an electromechanical coefficient of at least about 15%;
   at least one electrode disposed on the piezoelectric substrate and defined by a laminate having a metal layer defining a primary metal layer made of a metal having a density greater than that of Al or an alloy primarily composed of the metal and a metal layer which is laminated on the primary metal layer and which is made of another metal;
   a first $SiO_2$ layer disposed in a remaining area other than that at which said at least one electrode is located and having a thickness approximately equal to that of the at least one electrode;
   a second $SiO_2$ layer disposed to cover the at least one electrode and the first $SiO_2$ layer; and
   a silicon nitride compound layer disposed on the second $SiO_2$ layer; wherein
   the density of the at least one electrode is at least about 1.5 times that of the first $SiO_2$ layer.

2. The surface acoustic wave device according to claim 1, wherein when the thickness of the second $SiO_2$ film is represented by h, and the wavelength of a surface acoustic wave is represented by $\lambda$, $0.08 \leq h/\lambda \leq 0.5$ is satisfied.

3. The surface acoustic wave device, according to claim 1, wherein the silicon nitride compound layer is composed of an SiN layer, and when the thickness of the SiN layer is represented by h and the wavelength of a surface acoustic wave is represented by $\lambda$, $0 < h/\lambda \leq 0.1$ is satisfied.

4. The surface acoustic wave device according to claim 1, further comprising:
   a diffusion inhibition film made of SiN and disposed between the second $SiO_2$ layer and the at least one electrode; wherein
   when the thickness of the diffusion inhibition film is represented by h, and the wavelength of a surface acoustic wave is represented by $\lambda$, $0.005 \leq h/\lambda \leq 0.05$ is satisfied.

5. The surface acoustic wave device according to claim 1, wherein the at least one electrode is made of one of Cu, a Cu alloy, or a laminate film comprising a metal layer primarily composed of Cu or a Cu alloy.

6. The surface acoustic wave device according to claim 1, wherein the piezoelectric substrate is made of one of rotated Y-plate X-propagation $LiTaO_3$ or $LiNbO_3$, and when the thickness of the second $SiO_2$ layer is represented by $h_1$, the thickness of the silicon nitride compound layer formed on the second $SiO_2$ layer is represented by $h_2$, the wavelength of a surface acoustic wave is represented by $\lambda$, and the following equations are satisfied:
   coefficient $A_1 = -190.48$;
   coefficient $A_2 = 76.19$;
   coefficient $A_3 = -120.00$;
   coefficient $A_4 = -47.30$;
   coefficient $A_5 = 55.25$;
   $H_1 = h_1/\lambda$, $H_2 = h_2/\lambda$, and $\theta = (A_1 H_1^2 + A_2 H_1 + A_3)H_2 + A_4 H_1 + A_5$,
   a Y-X cut angle of the rotated Y-plate X-propagation piezoelectric substrate is in the range of $\theta \pm 5°$.

7. The surface acoustic wave device according to claim 1, wherein the density of the at least one electrode is at least about 2.5 times that of the first $SiO_2$ layer.

* * * * *